United States Patent
Arai

(10) Patent No.: US 6,730,557 B2
(45) Date of Patent: May 4, 2004

(54) SEMICONDUCTOR DEVICE AND PRODUCTION THEREOF

(75) Inventor: Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/902,300

(22) Filed: Jul. 10, 2001

(65) Prior Publication Data

US 2002/0048873 A1 Apr. 25, 2002

(30) Foreign Application Priority Data

Jul. 11, 2000 (JP) .................... P2000-210259

(51) Int. Cl.[7] .................... H01L 21/8249; H01L 27/082
(52) U.S. Cl. .................... 438/234; 438/231; 438/232; 438/237; 438/201; 438/203; 438/207; 257/588; 257/577; 257/627
(58) Field of Search .................... 438/234, 202, 438/204, 364, 339, 199, 223, 510, 237, 203, 201, 207, 189, 231, 232; 257/588, 64, 577, 627, 195, 350, 370

(56) References Cited

U.S. PATENT DOCUMENTS 5,045,493 A * 9/1991 Kameyama et al. ........ 438/234
5,227,660 A * 7/1993 Horiuchi et al. ............ 257/588

* cited by examiner

Primary Examiner—Matthew Smith
Assistant Examiner—Igwe U Anya
(74) Attorney, Agent, or Firm—Robert J. Depke; Holland & Knight LLP

(57) ABSTRACT

A semiconductor device having a bipolar transistor which is capable of high integration, and a semiconductor device in which the bipolar transistor has good characteristic properties. A process for producing said semiconductor device. The process consists of forming the electrode layer which covers the base region between the emitter and the collector and which connects to the semiconductor base through the opening formed in the insulating film at the part connecting to the base of the lateral bipolar transistor; forming from the same insulating film the side walls on the flanks of the gate electrode of the MOS transistor and the insulating film covering the base region between the emitter and the collector of the lateral bipolar transistor; forming the gate electrode of the MOS transistor; forming the insulating layer over the entire surface; forming the layers which cover, functioning as a mask, the base region between the emitter and the collector of the lateral bipolar transistor; and etching the insulating film, thereby forming the side wall for the gate electrode.

7 Claims, 16 Drawing Sheets

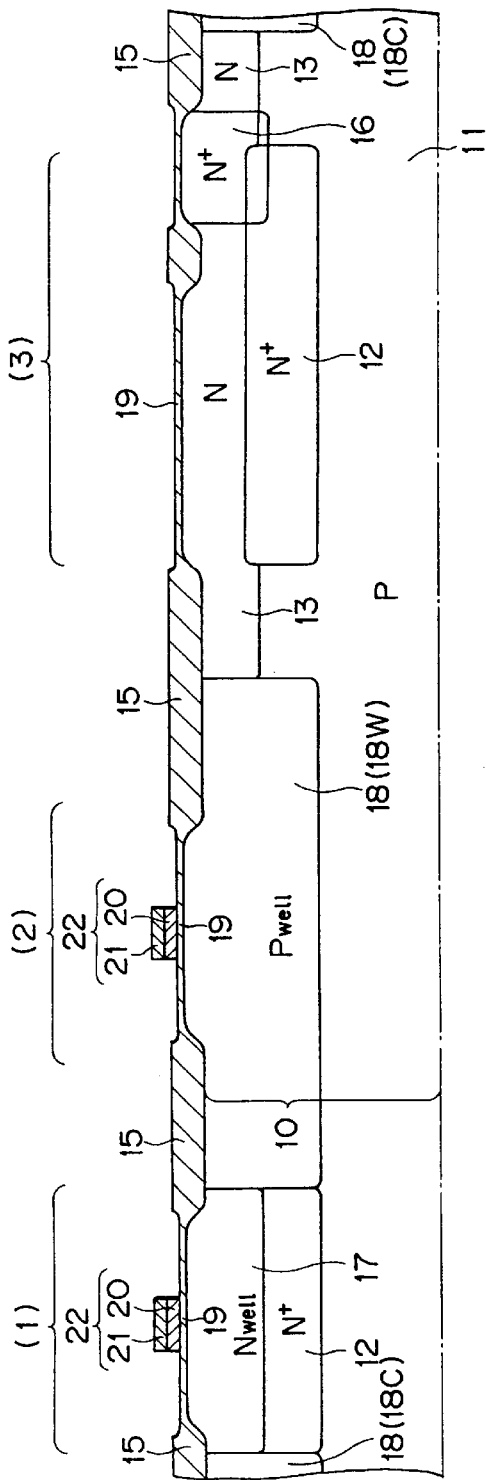
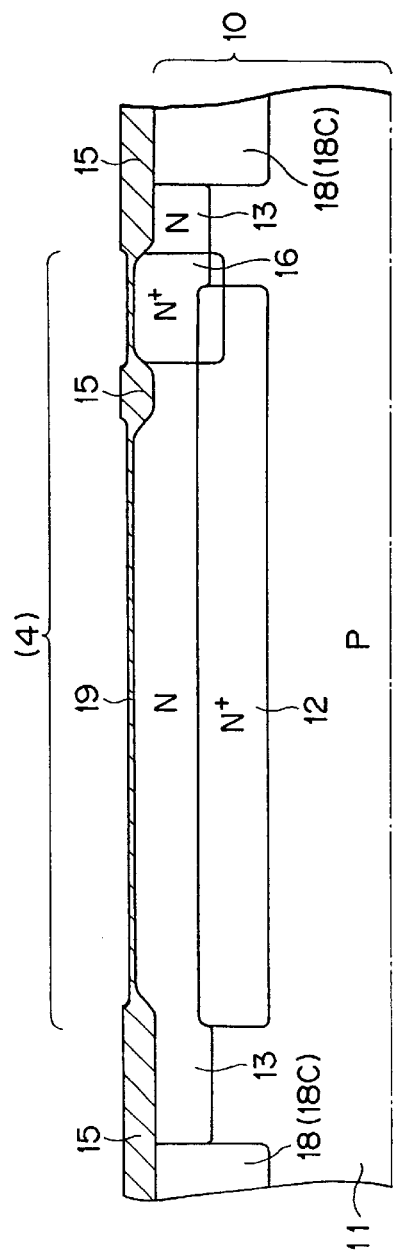

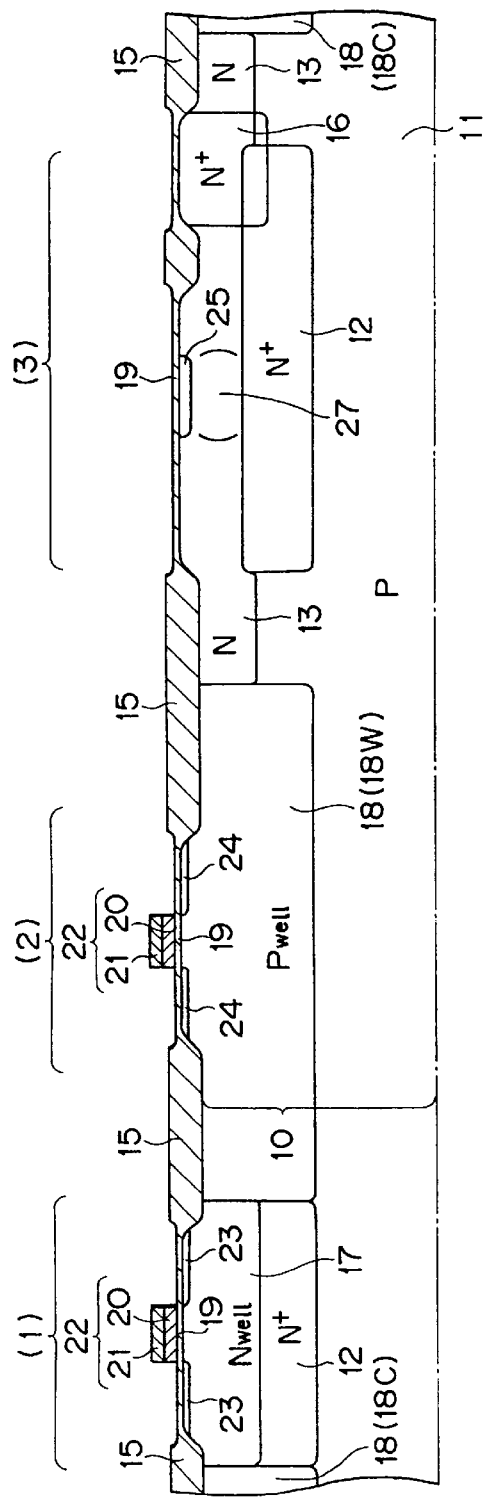
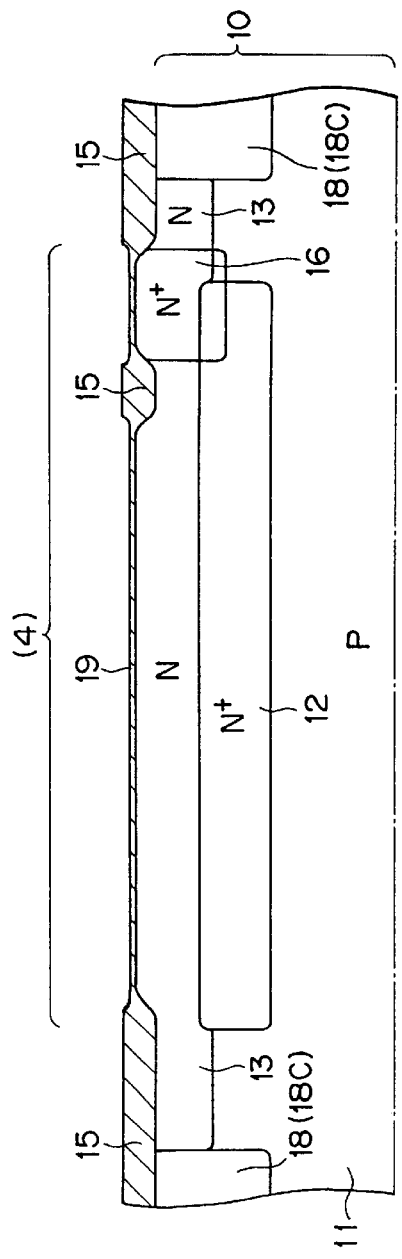

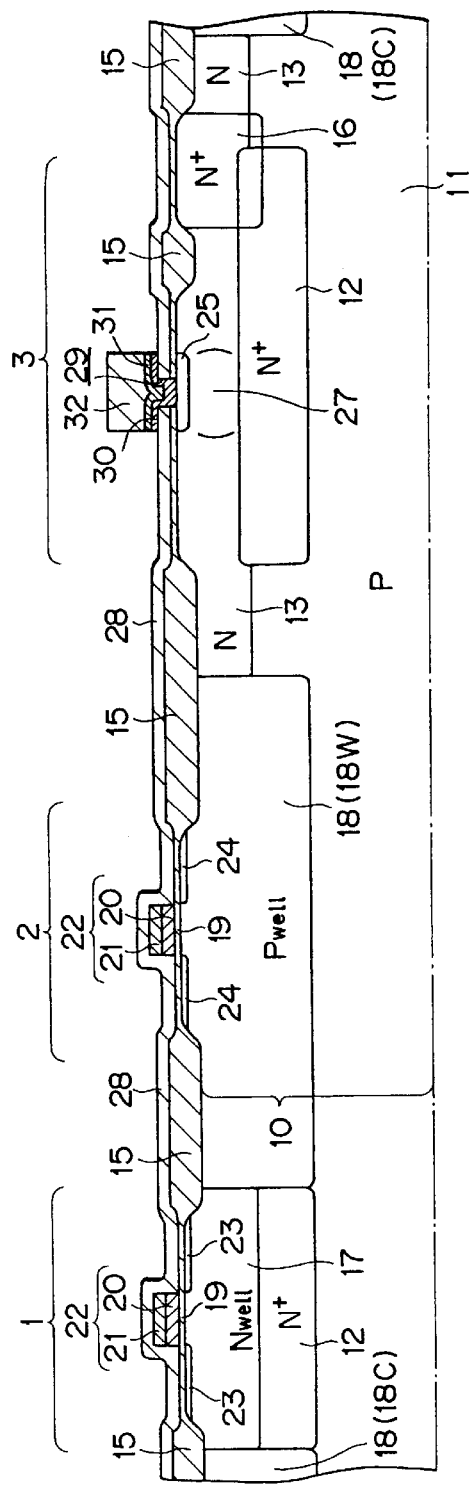
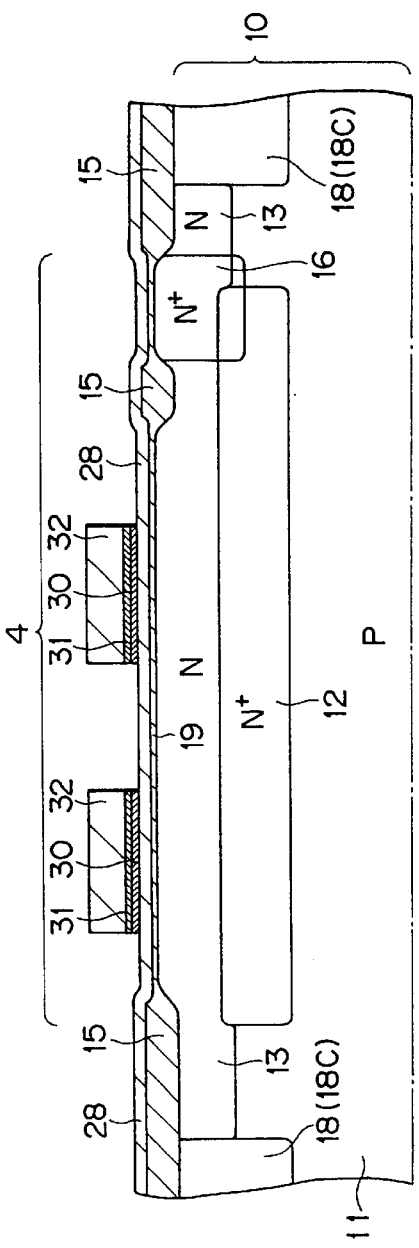

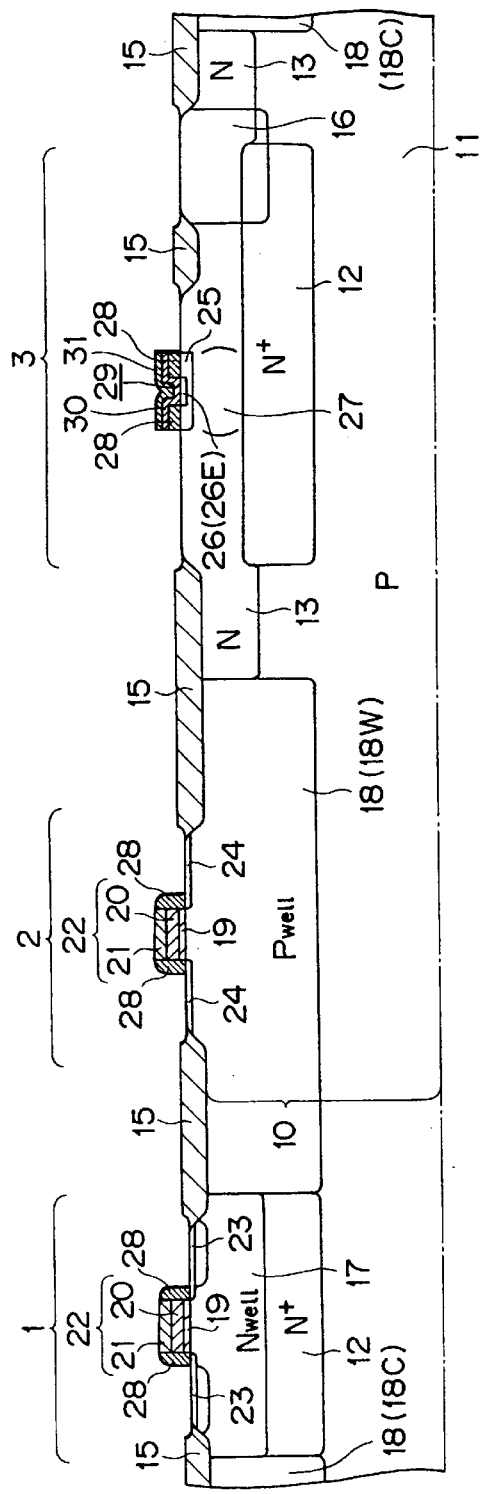
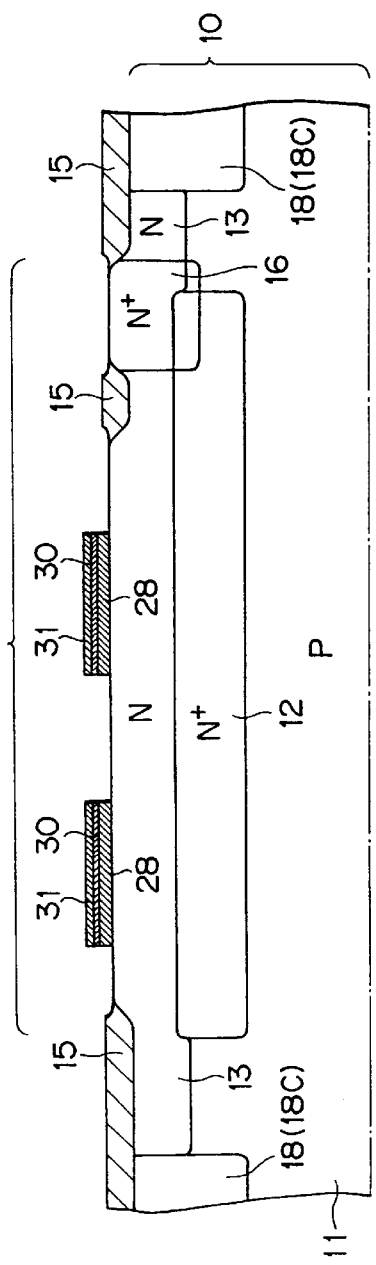

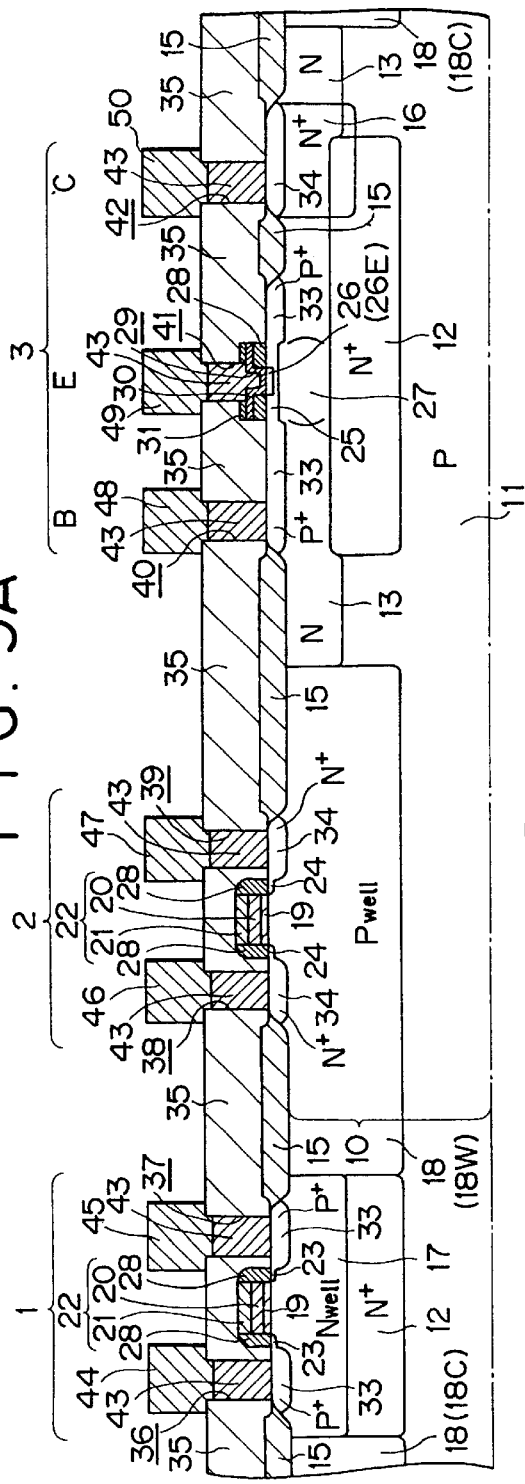
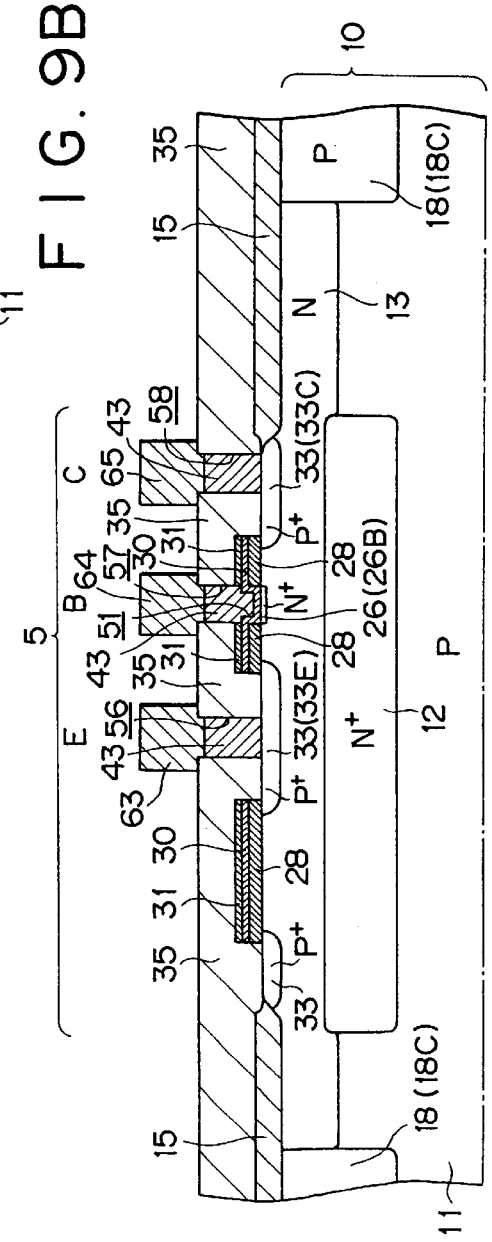
FIG. 9A
FIG. 9B

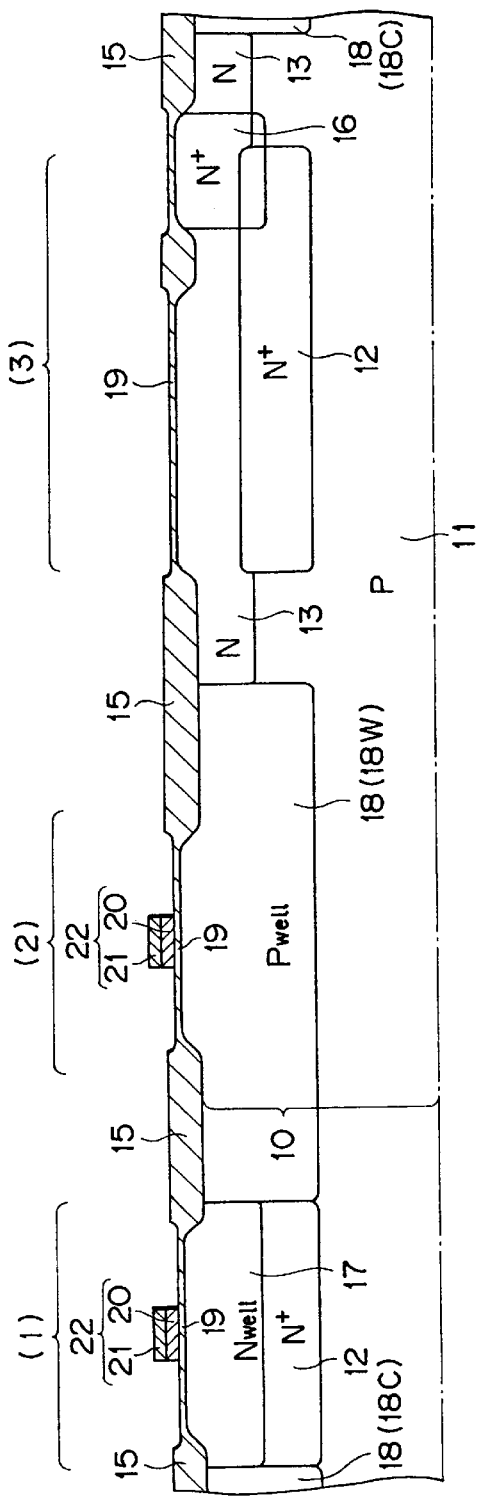
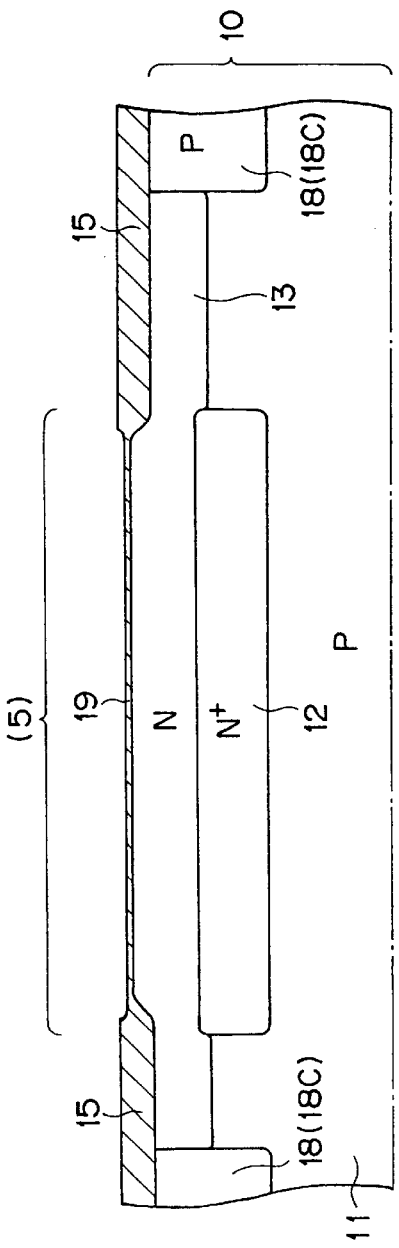

SEMICONDUCTOR DEVICE AND PRODUCTION THEREOF

RELATED APPLICATION DATA

The present invention claims priority to Japanese Application No. P2000-210259 filed Jul. 11, 2000, which application is incorporated herein by reference to the extent permitted by law.

BACKGROUND OF THE INVENTION

The present invention relates to a semiconductor device consisting of bipolar transistors and to a process for producing the same.

There is a semiconductor device called BiCMOS which consists of bipolar transistors and CMOS transistors formed on a common substrate. It displays high performance by virtue of the former's accurate analog processing ability and high-speed operation and the latter's high integration and low power consumption.

In the case where the MOS transistor is that of LDD (Lightly Doped Drain) structure, the gate electrode has side walls formed on its flanks, the LDD region is formed by introducing an impurity with the help of the gate electrode as a mask, and the source/drain regions are formed by introducing an impurity with the help of the gate electrode and side walls as a mask.

Incidentally, the LDD structure is characterized in that the MOS transistor has in its drain region a lightly doped region which permits the gate length to be reduced while relieving the electric field effect resulting from the reduced gate length.

In the case of the above-mentioned BiCMOS semiconductor device, the LDD structure can be formed in the same way as above if the MOS transistor has the LDD structure.

An example of the BiCMOS semiconductor device is explained in the following with reference to FIGS. 16A and 16B which are schematic sectional views showing its structure that is observed after side walls have been formed in its manufacturing process.

FIG. 16A is a schematic sectional view showing a PMOS transistor, an NMOS transistor, and a vertical NPN bipolar transistor (NPN transistor for short hereinafter). FIG. 16B is a schematic sectional view showing a lateral PNP transistor (LPNP transistor for short hereinafter).

As shown in FIGS. 16A and 16B, the BiCMOS semiconductor device consists of a PMOS transistor 101, an NMOS transistor 102, an NPN transistor 103, and an LPNP transistor 104.

On the P-type semiconductor substrate 111 is formed an N⁺ buried region 112 for the PMOS transistor 101, the NPN transistor 103, and the LPNP transistor 104. On the semiconductor substrate 111 is formed also an N-type epitaxial layer 113. These components constitute the semiconductor base 110.

On the surface of the semiconductor base 110 is formed an element isolating layer 115 by LOCOS, so that elements are isolated from one another.

Further, there is also formed a heavily doped N-type region 116 for connection to the collector of the NPN transistor 103 and the base of the LPNP transistor 104.

In the PMOS transistor 101 is formed an N-type semiconductor well region 117. In the NMOS transistor 102 is formed a P-type impurity region 118 which functions as both a P-type semiconductor well region 118W and a channel stop region 118C for the bipolar transistor.

On the semiconductor base 110 is formed a gate oxide film 119 for each of the PMOS and NMOS transistors 101 and 102. On the gate oxide film 119 is formed a gate electrode G of tungsten polycide which consists of an N-type polysilicon film 120 and a tungsten film 121.

The P-type LDD regions 124 are formed in those parts of the N-type semiconductor region 117 which are adjacent to both sides of the gate electrode G of the PMOS transistor 101.

Likewise, LDD regions 125 are formed in the NMOS transistor 102.

In addition, the gate electrode G in each of the PMOS and NMOS transistors 101 and 102 has on its flanks insulating side walls 128 which determine the width of the LDD regions 124 and 125.

These side walls 128 are formed by coating the entire surface with an insulating film and then performing reactive ion etching (RIE) on this insulating film.

When this reactive ion etching is carried out to form the side wall 128, the epitaxial layer 113 which is silicon is exposed except for those parts covered by the element isolating layer 115 and the polysilicon region (or gate electrode G). Therefore, RIE causes damage to the silicon.

The problem arises in the process of producing silicon semiconductor devices having MOS transistors.

In the case of MOS transistor, that region of the epitaxial layer (silicon) which exposes itself when the side walls are formed is the source/drain region.

The source/drain region is a heavily doped region and hence it affects only a little the transistor characteristics even though it is damaged by RIE.

However, in the case of BiCMOS semiconductor device shown in FIGS. 16A and 16B, damages due to RIE greatly affect the transistor characteristics because the bipolar transistors 103 and 104 are formed in the region where silicon exposes itself. This holds true particularly with the lateral bipolar transistor 104 formed near the surface of the semiconductor base. The result of damage is an increase in surface recombination current which in turn decreases the current amplification factor ($h_{FE}$) at low current, and this leads to poor reliability.

Therefore, it is important for the BiCMOS semiconductor device that the bipolar transistor, particularly its active region, should not be damaged by RIE.

In the meantime, a lateral bipolar transistor is formed in such a way that regions for the emitter, base, and collector spread out laterally. Consequently, it takes a larger area than a vertical bipolar transistor.

It is desirable to reduce the area for lateral bipolar transistors in order to increase the degree of integration of semiconductor devices.

SUMMARY OF THE INVENTION

The present invention was completed in view of the foregoing. It is an object of the present invention to provide a semiconductor device consisting of lateral bipolar transistors capable of high integration.

It is another object of the present invention to provide a semiconductor device consisting of lateral bipolar transistors with good characteristic properties and to provide a process for producing the semiconductor device.

The present invention is directed to a semiconductor device having lateral bipolar transistors formed on the semiconductor base, characterized in that an opening is formed in the insulating film on the semiconductor base at the base connecting part of the lateral bipolar transistor and an electrode of the base connecting part is formed such that it connects to the semiconductor base through the opening and it covers the base region between the emitter and the collector.

The semiconductor device of the present invention constructed as mentioned above offers the advantage that the base connecting part is formed on the region between the emitter and the collector. This structure makes it possible to reduce the cell size of the lateral bipolar transistor and to reduce the parasitic capacity.

In addition, the semiconductor device constructed as mentioned above offers the advantage that the emitter region and collector region can be formed on both sides of the base region by the self-alignment process that utilizes the electrode layer of the base connecting part. In other words, the base width is determined by self-alignment, and this leads to stable characteristics Moreover, self-alignment makes it possible to form the emitter region, base region, and collector region close to one another, and this helps reduce the cell size.

The present invention is directed also to a semiconductor device which is characterized in that lateral bipolar transistors and MOS transistors are formed on a common semiconductor base and side walls on the gate electrode of the MOS transistor and insulating film covering the base region of the base connecting part of the lateral bipolar transistor are formed with a common insulating film.

The advantage of the semiconductor device constructed as mentioned above is that the insulating film that covers the base region of the base connecting part of the lateral bipolar transistor protects the base region.

Another advantage is that it is possible to form side walls on the gate electrode of the MOS transistor and insulating film covering the base region by a single process (because they are formed with a common insulating film). The insulating film protects the base region (which is the active region of the lateral bipolar transistor) from damage when etching is carried out to form side walls for the MOS transistor.

The present invention is directed to a process for producing a semiconductor device having MOS transistors and lateral bipolar transistors formed on a common semiconductor base, the process comprising a step of forming the gate electrode of the MOS transistor, a step of forming an insulating film on the entire surface, a step of forming a layer which functions as a mask layer that covers the base region between the emitter and collector of the lateral bipolar transistor, and a step of etching the insulating film, thereby forming side walls for the gate electrode.

The above-mentioned process has a step of forming a layer which functions as a mask layer that covers the base region between the emitter and the collector of the lateral bipolar transistor. This layer as a mask protects from damage by etching the base region between the emitter and the collector which is the active region of the lateral bipolar transistor, when etching is performed on the insulating film to form side walls for the gate electrode.

DESCRIPTION OF THE DRAWINGS

FIGS. 4A and 4B are diagrams showing a step of producing the semiconductor device shown in FIGS. 1 and 2.

FIGS. 5A and 5B are diagrams showing a step of producing the semiconductor device shown in FIGS. 1 and 2.

FIGS. 6A and 6B are diagrams showing a step of producing the semiconductor device shown in FIGS. 1 and 2.

FIGS. 7A and 7B are diagrams showing a step of producing the semiconductor device shown in FIGS. 1 and 2.

FIGS. 9A and 9B are schematic sectional views showing the structure of the semiconductor device pertaining to another embodiment of the present invention.

FIGS. 11A and 11B are diagrams showing a step of producing the semiconductor device shown in FIGS. 9A and 9B.

DESCRIPTION OF THE PREFERRE EMBODIMENTS

Figure 1:
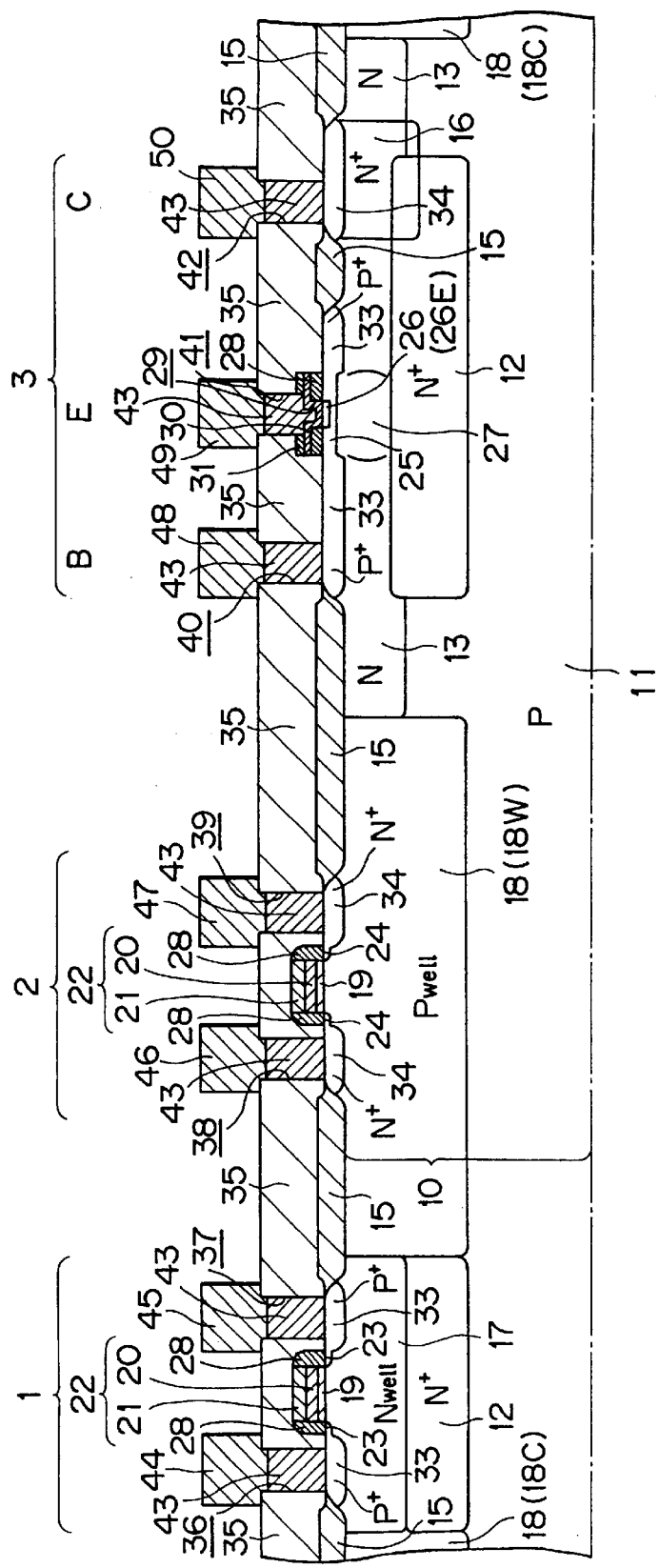
FIG. 1 is a schematic sectional view showing the structure of the semiconductor device pertaining to one embodiment of the present invention.

The present invention covers a semiconductor device having lateral bipolar transistors formed on the semiconductor base, characterized in that an opening is formed in the insulating film on the semiconductor base at the base connecting part of the lateral bipolar transistor and an electrode of the base connecting part is formed such that it connects to the semiconductor base through the opening and it covers the base region between the emitter and the collector.

According to the present invention, the semiconductor device mentioned above is constructed such that vertical bipolar transistors are additionally formed on the semiconductor base, and the electrode of the base connecting part covering the base region of the lateral bipolar transistor and the emitter electrode of the vertical transistor are formed from a common layer.

According to the present invention, the semiconductor device mentioned above is constructed such that an antireflection film is formed on the electrode layer for the base connecting part.

The present invention covers a semiconductor device which is characterized in that lateral bipolar transistors and MOS transistors are formed on a common semiconductor base and side walls on the gate electrode of the MOS transistor and insulating film covering the base region of the base connecting part of the lateral bipolar transistor are formed with a common insulating film.

According to the present invention, the semiconductor device mentioned above is constructed such that the electrode layer of the base connecting part at the base connecting part of the lateral bipolar transistor connects to the semiconductor base through the opening formed in the insulating film of the semiconductor base and covers the base region between the emitter and the collector.

According to the present invention, the semiconductor device mentioned above is constructed such that vertical bipolar transistors are additionally formed on the semiconductor base, and the electrode layer of the base connecting part that covers the base region and the emitter electrode of the vertical transistor are formed from a common layer.

According to the present invention, the semiconductor device mentioned above is constructed such that an anti-reflection film is formed on the electrode layer for the base connecting part.

The present invention covers a process for producing a semiconductor device having MOS transistors and lateral bipolar transistors formed on a common semiconductor base, the process comprising a step of forming the gate electrode of the MOS transistor, a step of forming an insulating film on the entire surface, a step of forming a layer which functions as a mask layer that covers the base region between the emitter and the collector of the lateral bipolar transistor, and a step of etching the insulating film, thereby forming side walls for the gate electrode.

According to the present invention, the above-mentioned process for producing a semiconductor device is modified such that the step of forming a layer to become a mask layer also forms the electrode layer for the base connecting part of the lateral bipolar transistor.

According to the present invention, the above-mentioned process for producing a semiconductor device further includes a step of introducing an impurity, thereby forming the emitter region and the collector region of the lateral bipolar transistor by self-alignment process that utilizes the layer as a mask.

According to the present invention, the above-mentioned process for producing a semiconductor device further includes a step of forming an anti-reflection layer on the uppermost layer of the layer as a mask and subsequently introducing an impurity, thereby forming the emitter region and the collector region of the lateral bipolar transistor.

Figure 2:
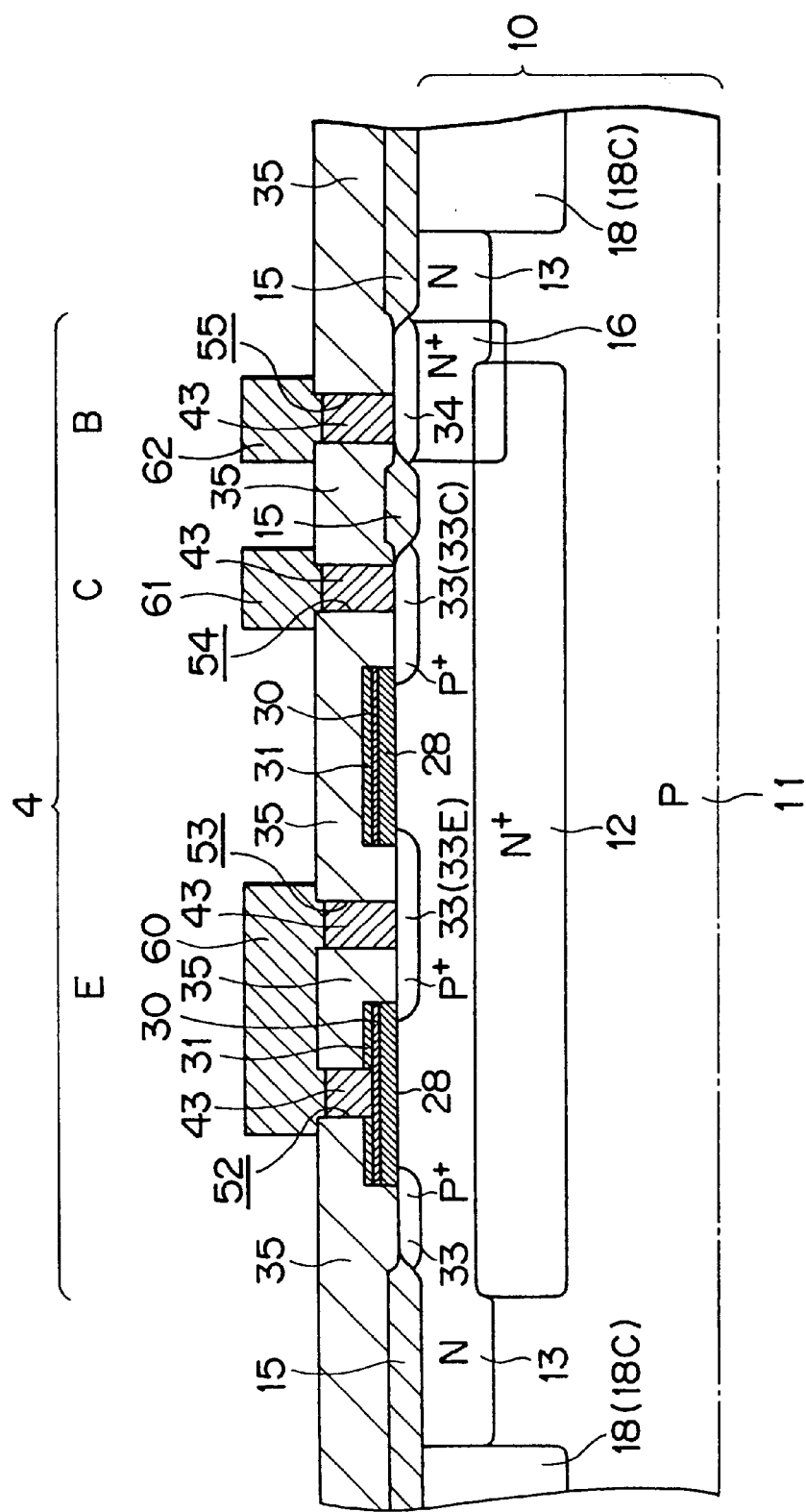
FIG. 2 is a schematic sectional view showing the structure of the semiconductor device pertaining to one embodiment of the present invention.

FIGS. 1 and 2 are schematic sectional views showing a BiCMOS semiconductor device according to one embodiment of the present invention.

The BiCMOS semiconductor device consists of two sections. The first section includes a PMOS transistor, an NMOS transistor, and a vertical NPN bipolar transistor, as shown in FIG. 1. The second section includes a lateral PNP bipolar transistor.

As shown in FIGS. 1 and 2, this BiCMOS semiconductor device consists of a semiconductor base 10 and transistors formed thereon. The semiconductor base 10 consists of a P-type silicon substrate 11 and an N-type silicon epitaxial layer 13 formed thereon. The transistors include a PMOS transistor 1, an NMOS transistor 2, a vertical NPN transistor 3 (NPN transistor for short hereinafter), and a lateral NPN bipolar transistor 4 (LPNP transistor for short hereinafter).

On the semiconductor base 10 is formed by LOCOS an element isolating layer 15 which isolates the transistors 1 to 4 from one another.

The PMOS transistor 1 has an $N^+$-type buried region 12 formed in the semiconductor base 10 and an N-type semiconductor well region 17 formed on the surface thereof.

In the N-type semiconductor well region 17 is formed a $p^+$-type source/drain region 33. Inside (adjacent to the channel) the source/drain region 33 is formed a P-type lightly doped LDD region 23.

On the channel is formed a gate electrode 22 of laminate structure consisting of a polysilicon film 20 and a tungsten film 21, with a gate oxide film 19 interposed between them.

On the flanks of the gate electrode 22 are formed side walls 28 of insulating film. The width of the side wall 28 determines the width of the LDD region 23.

To the source/drain region 33 is connected wiring of 44 and 45 of aluminum through a plug layer 43 of tungsten.

The NMOS transistor 2 has a P-type semiconductor well region 18W formed in the semiconductor base 10.

In this P-type semiconductor well region 18W is formed an $N^+$-type source/drain region 34. Within (adjacent to the channel) the source/drain region 34 is formed an N-type lightly doped LDD region 24.

On the channel is formed a gate electrode 22 of laminate structure consisting of a polysilicon film 20 and a tungsten film 21, with a gate oxide film 19 interposed between them.

On the flanks of the gate electrode 22 are formed side walls 28 of insulating film. The width of the side wall 28 determines the width of the LDD 24 region.

To the source/drain region 34 is connected wiring of 46 and 47 of aluminum through a plug layer 43 of tungsten.

Incidentally, the P-type impurity region 18 constituting the P-type semiconductor well region 18W is also formed between the NPN transistor 3 and the LPNP transistor 4. It functions also as a channel stop region 18C which isolates them from each other.

The vertical NPN bipolar transistor (NPN transistor) 3 has an $N^+$-type buried region 12 formed in the semiconductor base 10 consisting of the silicon substrate 11 and the N-type epitaxial layer 13.

In the N-type epitaxial layer 13 are formed a P-type base region (intrinsic base region and link base region) 25 and a graft base region 33 and further $N^+$-type emitter region 26.

In the collector connecting part is formed a collector connecting region 16 which is heavily doped with an N-type impurity for connection to the $N^+$-type buried region 12. On the surface of the collector connecting region 16 is formed a collector connecting part which is a heavily doped N-type impurity region 34.

To the emitter region 26 is connected an emitter electrode of polysilicon film 30.

To the graft base region 33, emitter electrode 30, and collector connecting part 34 are connected respectively metal electrodes 48, 49, and 50 of aluminum.

The bipolar transistor 3 constructed as mentioned above is a vertical bipolar transistor of so-called polywashed emitter structure.

The lateral NPN bipolar transistor (LPNP transistor) 4 has an $N^+$-type buried region 12 formed in the semiconductor base 10 consisting of the silicon substrate 11 and the N-type epitaxial layer 13.

In the N-type epitaxial layer 13 is formed a $p^+$-type emitter/collector region 33.

In this way the lateral bipolar transistor is formed in which the N-type epitaxial layer 13 functions as the base region and the vicinity of its surface permits the movement of carriers.

In the base connecting part is formed a highly doped N-type base connecting region 16 for connection to the N-type buried region 12. On the surface of this base connecting region 16 is formed a base connecting part of heavily doped N-type impurity region 34.

To the emitter region 33, collector region 33, and base connecting part 34 are connected respectively wiring 60, 61, and 62 of aluminum through a plug layer 43 of tungsten.

In this embodiment of the present invention, the LPNP transistor 4 is characterized in that the insulating film 28 is so formed as to cover the part held between the emitter region 33 and the collector region 33 (at which the N-type epitaxial layer 13 remains as the surface of the semiconductor base 10) and the insulating film 28 is covered with a polysilicon film 30.

The insulating film 28 in the PMOS transistor 1 and NMOS transistor 2 may be formed from the same material as used for the side walls 28 on the flanks of the gate electrode 22.

Also, the polysilicon film 30 may be formed from the same material as used for the polysilicon film 30 of the emitter electrode in the NPN transistor 3.

The source/drain region in the PMOS transistor 1, the graft base region in the NPN transistor 3, and the emitter/collector region in the LPNP transistor 4, which are indicated by the P-type impurity region 33, may be all identical in impurity concentration and depth.

The advantage of using the insulating film of other transistors and the same film as polysilicon film is that they can be formed by a single process.

According to this embodiment of the present invention, the NPN transistor 3 and the LPNP transistor 4 are characterized in that the anti-reflection film 31 is formed on the polysilicon film 30.

The anti-reflection film 31 offers the following advantages in fabrication.

(1) In the photolithography process to form the resist film by which the polysilicon film 30 is patterned, the anti-reflection film 31 prevents exposure light from being reflected by the surface of the polysilicon film 30.

Reflection of exposure light by the surface of the polysilicon film 30 causes the resist film to be exposed under different conditions from designed ones, with the result that the polysilicon film is not patterned as desired.

(2) In the ion implantation step using the polysilicon film 30 as a mask to form the impurity region of the NPN transistor 3 and LPNP transistor 4, the anti-reflection film 31 prevents impurities due to ion implantation from entering the polysilicon film 30.

In the NPN transistor 3, the graft base region is of P-type and the polysilicon film 30 of the emitter electrode is of N-type so that it forms the emitter region 26. Consequently, P-type impurities that enter the polysilicon film 30 during ion implantation to form the graft base region causes the P-type concentration to fluctuate in the polysilicon film 30, making it impossible to form the emitter region 26 with a desired impurity concentration.

According to this embodiment of the present invention, the LPNP transistor 4 is constructed such that the polysilicon film 30 at the left of the emitter region 33 (33E) is connected to the wiring 60 connected to the emitter region 33 (33E) through the plug layer 43.

This structure permits the polysilicon film 30 to have the same potential as that of the emitter region 33 (33E) and hence prevents the polysilicon film 30 from having a floating potential.

The sectional view in FIG. 2 shows that the LPNP transistor 4 has the polysilicon film 30 formed at separate two positions; in actuality, however, the polysilicon film 30 is formed such that it encircles the emitter region 33 (33E).

Therefore, the two polysilicon films 30 in FIG. 2 are connected to each other, so that the right polysilicon film 30 has the same potential as that of the emitter region 33 (33E).

This structure may be changed such that the polysilicon film 30 is connected to the wiring 61 of the collector region 33 (33C) so that it has the same potential as that of the collector region 33 (33C).

The semiconductor device shown in FIGS. 1 and 2 is produced by the process which is explained below with reference to FIGS. 3A to 8B.

Figure 3A:
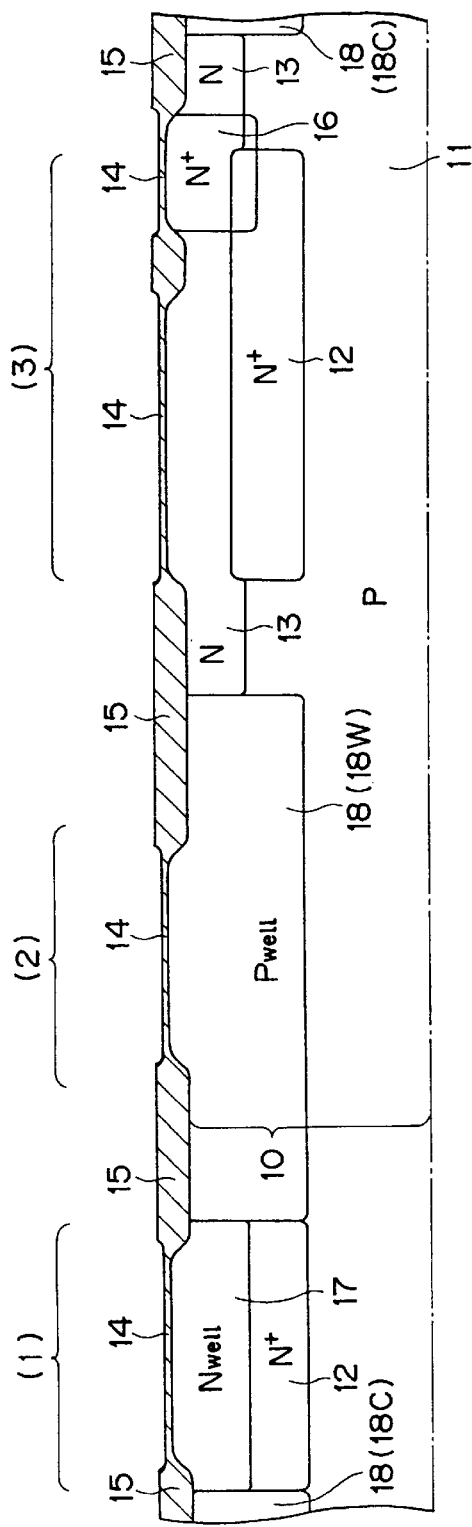
FIGS. 3A and 3B are diagrams showing a step of producing the semiconductor device shown in FIGS. 1 and 2.

The parts shown in FIG. 3A correspond to the parts shown in FIG. 1. The parts shown in FIG. 3B correspond to the parts shown in FIG. 2. The same correspondence as above applies to FIGS. 4A to 8B.

First, the P-type silicon substrate 11 of the first conduction type is prepared. See FIGS. 3A and 3B. The silicon substrate undergoes heat oxidation so that a 300-nm thick oxide film (not shown) is formed on its surface.

The silicon substrate 11 is coated with a photoresist film, which is subsequently patterned by lithography. The patterned resist film has openings at the positions where the NPN transistor 3, the LPNP transistor 4, and the PMOS transistor 1 are to be formed on the silicon substrate 11.

Wet etching with hydrofluoric acid is performed on the oxide film formed on the silicon substrate 11 through the resist film as an etching mask. Thus, openings are formed in the oxide film.

The photoresist film used as an etching mask is removed by using a mixture of hydrogen peroxide and sulfuric acid.

Antimony is diffused into the silicon substrate 11 through the openings formed in the oxide film. This step is accomplished by heating antimony oxide ($Sb_2O_3$) at 1200° C. for 60 minutes. This thermal diffusion gives rise to the buried region 12 of the second conduction type (N-type ($N^+$) in this embodiment) in the silicon substrate 11.

Now, the N-type buried region 12 is formed at the positions where the NPN transistor 3, the LPNP transistor 4, and the PMOS transistor 1 are to be formed.

Wet etching with hydrofluoric acid is performed to selectively remove the oxide film.

The N-type epitaxial layer 13 (1-$\mu$m thick, having a resistivity of 1 $\Omega$-cm) is formed by epitaxy on the silicon substrate 11.

In this way there is obtained the semiconductor base 10 which consists of the silicon substrate 11 and the N-type epitaxial layer 13.

The element isolating layers 15 are formed in the N-type epitaxial layer 13 by LOCOS as follows.

The surface of the N-type epitaxial layer 13 is thermally oxidized to form the silicon oxide film 14 (30 nm thick). On the silicon oxide film 14 is formed a 100-nm thick silicon nitride film (not shown) by reduced pressure CVD. The silicon nitride film is selectively removed by reactive ion etching. With the silicon nitride film remaining unetched used as an oxidation-resistant mask, the surface of the N-type epitaxial layer 13 is thermally oxidized in a wet oxygen atmosphere at 1050° C. so that the element isolating layer 15 having 450 nm thick is formed. The silicon nitride film is selectively removed by etching with hot phosphoric acid at 150° C.

The N-type regions 16 connecting to the buried region 12 are formed at the positions where the NPN transistor 3 and the LPNP transistor are to be formed in the N-type epitaxial layer 13.

To form the N-type regions 16, a resist film (not shown) is formed which has openings at the positions where the N-type regions 16 are to be formed. With this resist film used as an etching mask, doping with phosphorus is carried out by ion implantation with an energy of 500 keV for a dose of $2 \times 10^{12}/cm^2$ and with an energy of 70 keV for a dose of $7 \times 10^{15}/cm^2$.

The resist film used as an etching mask is removed in the usual way.

Then, the MOS transistors 1 and 2 are formed.

That part of the N-type epitaxial layer 13 where the PMOS transistor 1 is to be formed is doped with phosphorus by ion implantation with an energy of 600 keV for a dose of $5 \times 10^{12}/cm^2$ and with an energy of 300 keV for a dose of $3 \times 10^{12}/cm^2$. In this way the N-type semiconductor well region 17 is formed.

Doping with boron for Vth control is performed by ion implantation with an energy of 20 keV for a dose of $5 \times 10^{12}/cm^2$.

Doping with boron (as a P-type impurity) is performed by ion implantation on that part of the N-type epitaxial layer 13 and silicon substrate 11 where the NMOS transistor 2 is formed and on that part of the N-type epitaxial layer 13 and silicon substrate 11 which is held between the parts where the NPN transistor 3 and LPNP transistor 4 are formed. Ion implantation is carried out with an energy of 800 keV for a dose of $5 \times 10^{12}/cm^2$, with an energy of 350 keV for a dose of $5\times10^{12}/cm^2$, and with an energy of 100 keV for a dose of $5\times10^{12}/cm^2$. In this way there is formed the region 18 doped with a P-type impurity which functions as the P-type semiconductor well region 18 (18W) and the channel stop region 18 (18C).

Figure 3B:
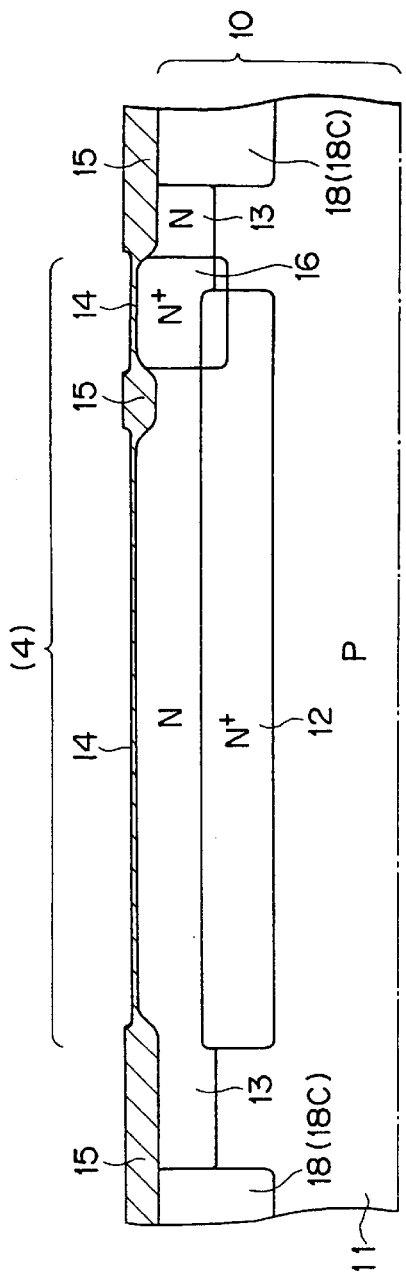

Doping for Vth control is performed by ion implantation with an energy of 20 keV for a dose of $2\times10^{12}/cm^2$. The foregoing steps are illustrated in FIGS. 3A and 3B.

The silicon oxide film 14 is removed by wet etching with hydrofluoric acid.

Oxidation is carried out in a wet oxygen atmosphere at 850° C. for 5 minutes.

In this way there is formed the gate oxide film 19 (5 nm thick) in the region except for the element isolating layer 15.

The polysilicon film 20 (100 nm thick), which becomes the gate electrode, is formed by low pressure CVD.

The polysilicon film 20 is heavily doped with phosphorus by predeposition of phosphorus trichloride oxide ($POCl_3$).

The tungsten silicide film 21 (100 nm thick) is formed by CVD. The tungsten silicide film 21 and the polysilicon film 20 are selectively removed, except for the part constituting the gate electrode of the MOS transistor, by ordinary lithography technology and reactive ion etching.

In this way there is formed the gate electrode 22 of tungsten polysilicide structure consisting of the polysilicon film 20 and the tungsten silicide film 21 in those parts where the PMOS transistor 1 and the NMOS transistor 2 are formed. The foregoing steps are illustrated in FIGS. 4A and 4B.

The part where the PMOS transistor 1 is to be formed undergoes doping with a P-type impurity, such as boron difluoride ($BF_2$), by ion implantation with an energy of 25 keV for a dose of $2\times10^{13}/cm^2$. This doping forms the P-type LDD region 23 in that part of the N-type semiconductor well region 17 at both sides of the gate electrode 22.

The part where the NMOS transistor 2 is to be formed undergoes doping with an N-type impurity, such as arsenic, by ion implantation with an energy of 60 keV for a dose of $3.5\times10^{13}/cm^2$. This doping forms the N-type LDD region 24 in that part of the P-type semiconductor well region 18W at both sides of the gate electrode 22.

The part where the NPN transistor 3 is to be formed undergoes doping with a P-type impurity, such as boron difluoride, by ion implantation with an energy of 30 keV for a dose of $5\times10^{13}/cm^2$. This doping forms the intrinsic base and link base region 25.

Doping with an N-type impurity, such as phosphorus, is performed by ion implantation with an energy of 120 keV for a dose of $2\times10^{12}/cm^2$ and an energy of 360 keV for a dose of $3\times10^{12}/cm^2$, through the same opening. This step forms the SIC 27 (Selective Ion Implantation of Collector). The foregoing steps are illustrated in FIGS. 5A and 5B.

The region 25 which functions as both the intrinsic base and the link base of the NPN bipolar transistor 3 may be of the same size (width) as the polysilicon film 30 (to be formed later) connecting to the emitter.

The silicon oxide film 28 (200 nm thick), which is used to form LDD, is formed by CVD.

The opening 29 is formed by ordinary lithography technology and reactive ion etching at that part in the silicon oxide film 28 where the emitter of the NPN transistor 3 is to be formed.

The polysilicon film 30 (150 nm thick) which is heavily doped with arsenic (N-type impurity) is formed by CVD.

The anti-reflection film 31 is formed which consists of a silicon oxide film (10 nm thick) formed by CVD and a silicon nitride oxide film (110 nm thick) formed by CVD.

The entire surface is coated with the photoresist 32, which is subsequently patterned by ordinary lithography to determine the width of the emitter electrode (polysilicon film 30) of the NPN transistor 3 and the width of the base of the LPNP transistor 4.

Reaction ion etching, which employs the photoresist 32 as a mask, is performed to pattern the anti-reflection film 31 and the polysilicon film 30 consecutively. The foregoing steps are illustrated in FIGS. 6A and 6B.

The pattern distance of the polysilicon film 30 determines the base width of the LPNP transistor 4 shown in FIG. 6B.

The silicon oxide film 28 undergoes reactive ion etching which employs the photoresist 32 as a mask. Thus, the side walls 28 are formed on the flanks of the gate electrode 22 of the PMOS transistor 1 and the NMOS transistor 2.

This reactive ion etching does not cause damage to the N-type epitaxial layer 13 which becomes the base region layer in the LPNP transistor 4, because it is covered by the silicon oxide film 28 and the polysilicon film 30.

The photoresist 32 is then removed.

In the LPNP transistor 4, there remain the silicon oxide film 28, the polysilicon film 30, and the anti-reflection film 31, which cover that part of the N-type epitaxial layer 13 which becomes the base region afterward. The foregoing steps are illustrated in FIGS. 7A and 7B.

A 10-nm thick silicon oxide film (not shown) is formed by CVD. It is grown to 12 nm by thermal oxidation.

Doping with an N-type impurity, such as arsenic, is performed by ion implantation with an energy of 35 keV for a dose of $5\times10^{15}/cm^2$ on the regions where the NMOS transistor 2, the NPN transistor 3, and the LPNP transistor 4 are to be formed.

Thus there is formed the N-type impurity region 34 which functions as the source/drain region in the NMOS transistor 2, as connection to the collector of the NPN transistor 3, and as connection to the base of the LPNP transistor 4.

Doping with a P-type impurity, such as boron difluoride, is performed with an energy of 35 keV for a dose of $3\times10^{15}/cm^2$ on the regions where the PMOS transistor 1, the NPN transistor 3, and the LPNP transistor 4 are to be formed.

Figure 8A:
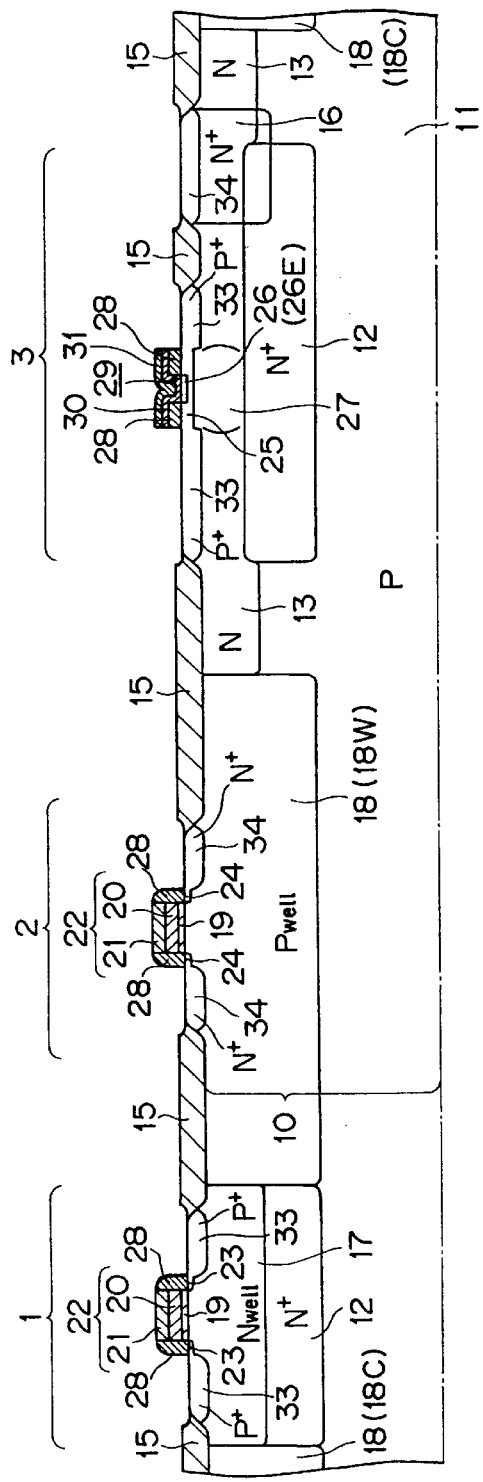
FIGS. 8A and 8B are diagrams showing a step of producing the semiconductor device shown in FIGS. 1 and 2.
Figure 8B:
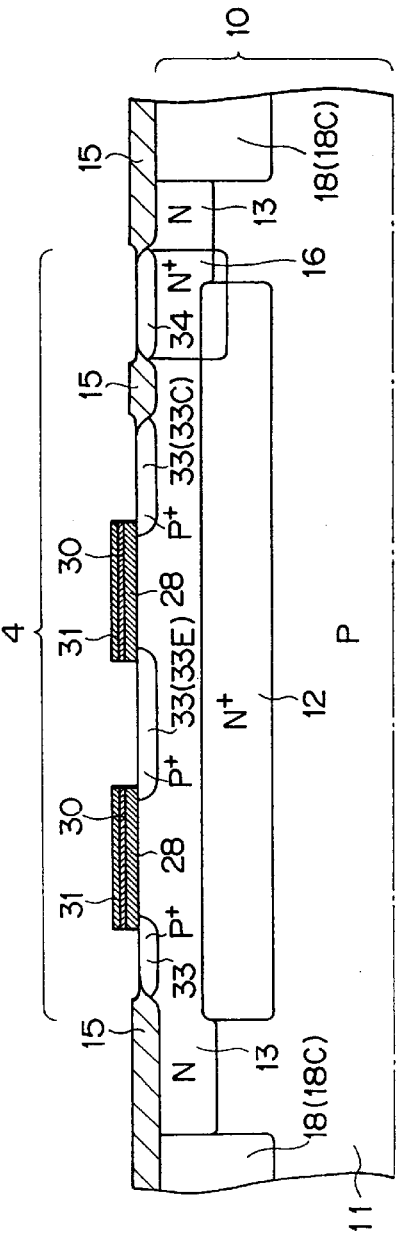

Thus there is formed the P-type impurity region 33 which functions as the source/drain region of the PMOS transistor 1, as the graft base region of the NPN transistor 3, and as the emitter region 33E/collector region 33C of the LPNP transistor 4. The foregoing steps are illustrated in FIGS. 8A and 8B.

It is to be noted that the graft base region of the NPN transistor 3 and the emitter/collector region of the LPNP transistor 4 are determined through self alignment by the polysilicon film 30 and the anti-reflection film 31 thereon.

Therefore, in the LPNP transistor 4, the emitter-collector distance is determined by the width of the polysilicon film 30.

The anti-reflection film 31 functions as a mask at the time of doping with a P-type impurity by ion implantation to form the graft base region of the NPN transistor 3 and the emitter/collector region of the LPNP transistor 4. Therefore, the anti-reflection film 31 protects the polysilicon film 30 from being doped with a P-type impurity. The peak concentration of the P-type impurity remains in the anti-reflection film 31.

The steps mentioned above are followed by ordinary steps employed in the production of BiCMOS semiconductor devices.

For example, the wafer undergoes heat treatment (or RTA=Rapid Thermal Annealing) at 1000° C. for 10 seconds to activate the impurity. Then, the wafer is entirely coated with boron-phosphorus silicate glass (BPSG) to form the interlayer insulator 35. This step is followed by reflowing at 900° C. for 20 minutes in a nitrogen atmosphere so as to smoothen the surface of the interlayer insulator 35.

Those openings (contact holes) listed below are made in the interlayer insulator 35. Each contact hole is filled layer with the plug layer 43 for wire connection.

The openings 36 and 37 which reach the source/drain region 33 of the PMOS transistor 1. The openings 38 and 39 which reach the source/drain region 34 of the NMOS transistor 2. The opening 40 which reaches the external base region 33 of the NPN transistor 3. The opening 41 which reaches the polysilicon film 30 of the emitter electrode. The opening 42 which reaches the heavily doped N-type region 34. The opening 52 which reaches the electrode 30 connecting to the base of the LPNP transistor 4. The opening 53 which reaches the emitter region 33. The opening 54 which reaches the collector region 33. The opening 55 which reaches the part 34 connecting to the base.

Each of the openings 36 to 42 and 52 to 55 is filled with tungsten to form the plug layer 43 in the usual way, and wiring to each part is made as follows through the plug layer 43 by the ordinary wiring technique.

The wiring 44 and 45 for connection to the source/drain region 33 of the PMOS transistor 1. The wiring 46 and 47 for connection to the source/drain region 34 of the NMOS transistor 2. The wiring 48 for connection to the external base region 33 of the NPN transistor 3. The wiring 49 for connection to the polysilicon film 30 of the emitter electrode of the NPN transistor 3. The wiring 50 for connection to the heavily doped N-type region 34 of the NPN transistor 3. The wiring 60 for connection to the polysilicon film 30 and the emitter region 33E of the LPNP transistor 4. The wiring 61 for connection to the collector region 33C of the LPNP transistor 4. The wiring 62 for connection to the region 34 connecting to the base of the LPNP transistor 4.

Now, the PMOS transistor 1, the NMOS transistor 2, the NPN bipolar transistor 3, and the LPNP transistor 4 are formed on the semiconductor base 10, and there is obtained the BiCMOS semiconductor device as shown in FIGS. 1 and 2.

The advantage of the above-mentioned embodiment is that the surface of the base region 13 in the LPNP transistor 4 is protected from damage due to etching because that part of the N-type epitaxial layer 13 which becomes the base region is covered with the silicon oxide film 28 and the polysilicon film 30.

Thus it is possible to prevent the current-amplification factor $h_{FE}$ at low current from decreasing when the surface recombination current increases in the LPNP transistor 4.

This leads to improvement in the reliability of the BiCMOS semiconductor device.

The polysilicon film 30 serves for self alignment when the heavily doped emitter region and collector region are formed in the LPNP transistor 4.

Consequently, the heavily doped emitter region and collector region are formed in those parts on the surface of the N-type epitaxial layer 13 which are not covered by the silicon oxide film 28 and the polysilicon film 30. Thus the N-type epitaxial layer 13 keeps its characteristic properties almost intact even though its surface is damaged by etching.

Moreover, the above-mentioned structure permits the polysilicon film 30 to determine the emitter-collector distance.

Since the NPN transistor 3 is constructed such that the N-type epitaxial layer 13 is covered with the silicon oxide film 28 and the polysilicon film 30, the surface of the base region 13 is protected from damage due to etching.

The polysilicon film 30 of the emitter electrode serves for self alignment when the heavily doped graft base is formed. Thus the graft base region keeps its characteristic properties almost intact even though its surface is damaged by etching.

The above-mentioned embodiment offers the following advantages.

The resist film can be patterned as desired by exposure on account of the anti-reflection film 31 formed on the polysilicon film 30 in the NPN transistor 3 and the LPNP transistor 4.

The anti-reflection film 31 protects the polysilicon film 30 from being doped with a P-type impurity at the time of ion implantation to form the P-type impurity region 33, with the peak concentration of impurity remaining within the anti-reflection film 31.

A common insulating film constitutes the insulating film 28 as the side walls on the flanks of the electrode 22 in the MOS transistors 1 and 2, the insulating film 28 under the polysilicon film 30 of the emitter electrode in the NPN transistor 3, and the insulating film 28 covering the base region 13 between the emitter region and the collector region in the LPNP transistor 4. Therefore, these insulating films can be formed simultaneously by the same step.

Likewise, a common insulating film constitutes the polysilicon film 30 of the emitter electrode of the NPN transistor 3 and the polysilicon film 30 covering the base region 13 between the emitter region and the collector region of the LPNP transistor 4. Therefore, these polysilicon films can be formed simultaneously by the same step.

The P-type impurity regions 33 having the identical impurity concentration and depth function as the source/drain region 33 of the PMOS transistor 1, the external base region of the NPN transistor 3, and the emitter region 33E and the collector region 33C of the LPNP transistor 4. Therefore, these regions can be formed simultaneously by the same step.

The fact that one film for one transistor is identical with another film for another transistor means that they can be formed simultaneous by the same step. Fabrication in this manner requires a less number of steps than forming films individually. Thus it is possible to produce an improved BiCMOS semiconductor device without increasing the number of manufacturing steps.

The fact that the LPNP transistor 4 is constructed such that the polysilicon film 30 (which covers the base region 13 between the emitter region 33E and the collector region 33E) is connected to the wiring of the emitter region 33E permits the polysilicon film 30 to remain at the same potential as the emitter region 33E (or collector region 33C). This prevents the potential of the polysilicon film 30 from floating.

The second embodiment of the present invention will be described in the following.

This embodiment is characterized in that the lateral bipolar transistor is constructed differently from the conventional one so as to achieve the high degree of integration.

FIGS. 9A and 9B are schematic sectional views showing the BiCMOS semiconductor device pertaining to the second embodiment of the present invention.

The BiCMOS semiconductor device consists of a PMOS transistor, an NMOS transistor, a vertical NPN bipolar transistor, and a lateral PNP bipolar transistor. The first three are shown in FIG. 9A and the last one is shown in FIG. 9B.

As shown in FIGS. 9A and 9B, the BiCMOS semiconductor device pertaining to the second embodiment is similar to that (shown in FIGS. 1 and 2) pertaining to the first embodiment. It consists of the semiconductor base 10 (which consists of the P-type silicon substrate 11 and the N-type silicon epitaxial layer 13 formed thereon), the PMOS transistor 1, the NMOS transistor 2, the vertical NPN bipolar transistor 3 (NPN transistor for short hereinafter), and the lateral PNP bipolar transistor 5 (LPNP transistor for short hereinafter).

The PMOS transistor 1, the NMOS transistor 2, and the NPN transistor 3, which are shown in FIG. 9A, are of the same structure as those shown in FIG. 1.

The semiconductor device pertaining to this embodiment is characterized in that the LPNP transistor 5 shown in FIG. 9B is constructed differently from the LPNP transistor 4 shown in FIG. 2.

To be concrete, the LPNP transistor 5 has the N-type semiconductor epitaxial layer 13 in which the region 26 (26B) connecting to the $N^+$-base is formed between the P-type emitter region 33E and the P-type collector region 33C.

Moreover, the region 26 (26B) connecting to the base adjoins the polysilicon film 30.

The polysilicon film 30 adjoins the silicon of the semiconductor base 10 through the opening 51 in the insulating film 28.

In addition, on the polysilicon film 30 is formed the anti-reflection film 31.

The width of the polysilicon film 30 connecting to the base determines by itself the emitter-collector distance.

In other words, the part connecting to the base in the LPNP transistor 5 is constructed in the same way as the part connecting to the emitter in the NPN transistor 3.

This structure permits the part connecting to the base in the LPNP transistor 5 to be formed by the same step simultaneously with the part connecting to the emitter in the NPN transistor 3.

The fact that the LPNP transistor 5 is constructed as mentioned above permits the part connecting to the base to be formed between the emitter region and the collector region. The result is a reduction in area occupied by the LPNP transistor 5.

This is apparent from comparison with the LPNP transistor 4 shown in FIG. 2.

Incidentally, the polysilicon film 30 does not float because it is connected to the wiring 64 connecting to the base. This makes it unnecessary for the polysilicon film 30 to have the same potential as that of the emitter region 33E or the collector region 33C.

Other structures than mentioned above of the LPNP transistor 5 are identical with those of the LPNP transistor 4 shown in FIG. 2. Their explanation is not repeated.

The semiconductor device pertaining to this embodiment shown in FIGS. 9A and 9B is produced by the process which is explained in the following with reference to FIGS. 10A to 15B.

Figure 10A:
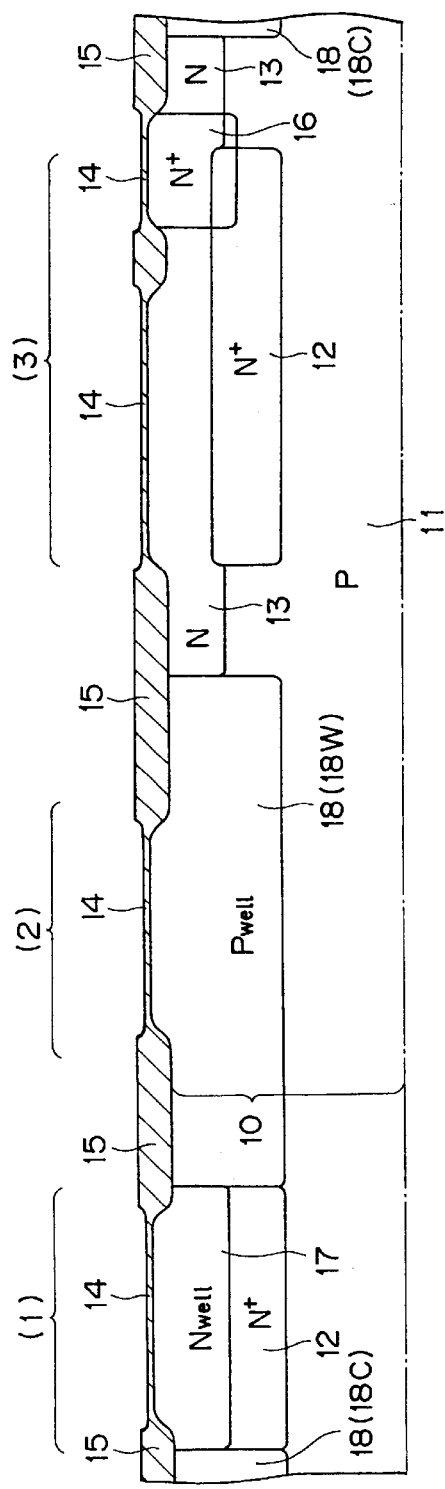
FIGS. 10A and 10B are diagrams showing a step of producing the semiconductor device shown in FIGS. 9A and 9B.

The parts shown in FIG. 9A correspond to the parts shown in FIG. 10A. The parts shown in FIG. 9B correspond to the parts shown in FIG. 10B. The same correspondence as above applies to FIGS. 11A to 15B.

The same steps as those in the first embodiment are explained briefly.

First, the silicon substrate 11 of the first conduction type (P-type in this embodiment) is made ready. In the silicon substrate 11 is formed the N-type ($N^+$) buried region 12 for the part where NPN transistor 3 is formed, the part where the LPNP transistor 5 is formed, and the part where the PMOS transistor 1 is formed.

On the silicon substrate 11 is formed by epitaxy the N-type epitaxial layer 13 (1 $\mu$m thick, having a resistivity of 1 $\Omega$-cm). Thus there is formed the semiconductor base 10 consisting of the silicon substrate 11 and the N-type epitaxial layer 13.

On the N-type epitaxial layer 13 is formed by LOCOS the element isolating layer 15.

The heavily doped N-type region 16 connecting to the buried region 12 is formed in the N-type epitaxial layer 13 at the part where the NPN transistor 3 is to be formed.

In this embodiment, the heavily doped N-type region 16 is not formed at the part where the LPNP transistor 5 is to be formed.

The N-type semiconductor well region 17 is formed in the N-type epitaxial layer 13 at the part where the PMOS transistor 1 is to be formed.

Figure 10B:
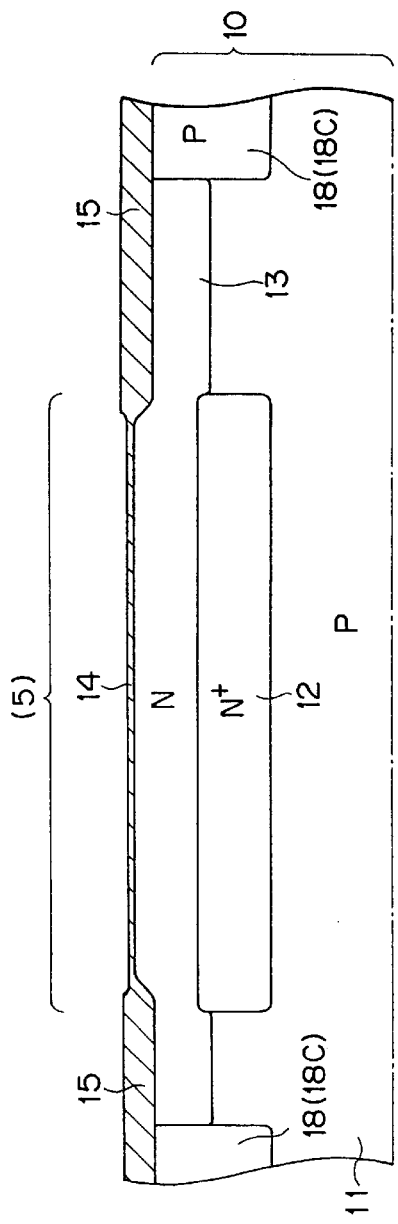

The P-type doped region 18, which becomes the P-type semiconductor well region 18 (18W) and the channel stop region 18 (18C) later, is formed at the part where the NMOS transistor 2 is to be formed and the part between the part where the NPN transistor 3 is to be formed and the part where the LPNP transistor 5 is to be formed. The foregoing steps are illustrated in FIGS. 10A and 10B.

The oxide film 14 is removed, and then the gate oxide film 19 is formed in the area except for the element isolating layer 15.

The polysilicon film 20, which becomes the gate electrode later, is formed, and then it is heavily doped with phosphorus.

On the polysilicon film 20 is formed the tungsten silicide film 21.

The tungsten silicide film 21 and the polysilicon film 20 are selectively removed by etching, except for the gate electrode of the MOS transistor. The gate electrode 22 consisting of the polysilicon film 20 and the tungsten silicide film 21 is formed in the part where the PMOS transistor 1 and the NMOS transistor 2 are to be formed. The foregoing steps are illustrated in FIGS. 11A and 11B.

The P-type LDD region 23 is formed by ion implantation in the N-type semiconductor well region 17 at both sides of the gate electrode 22 in the part where the PMOS transistor 1 is to be formed.

The N-type LDD region 24 is formed by ion implantation in the P-type semiconductor well region 18 at both sides of the gate electrode 22 in the part where the NMOS transistor 2 is to be formed.

The region 25 which becomes the intrinsic base and the link base are formed by ion implantation with P-type impurity in the part where the NPN transistor 3 is to be formed.

Figure 12A:
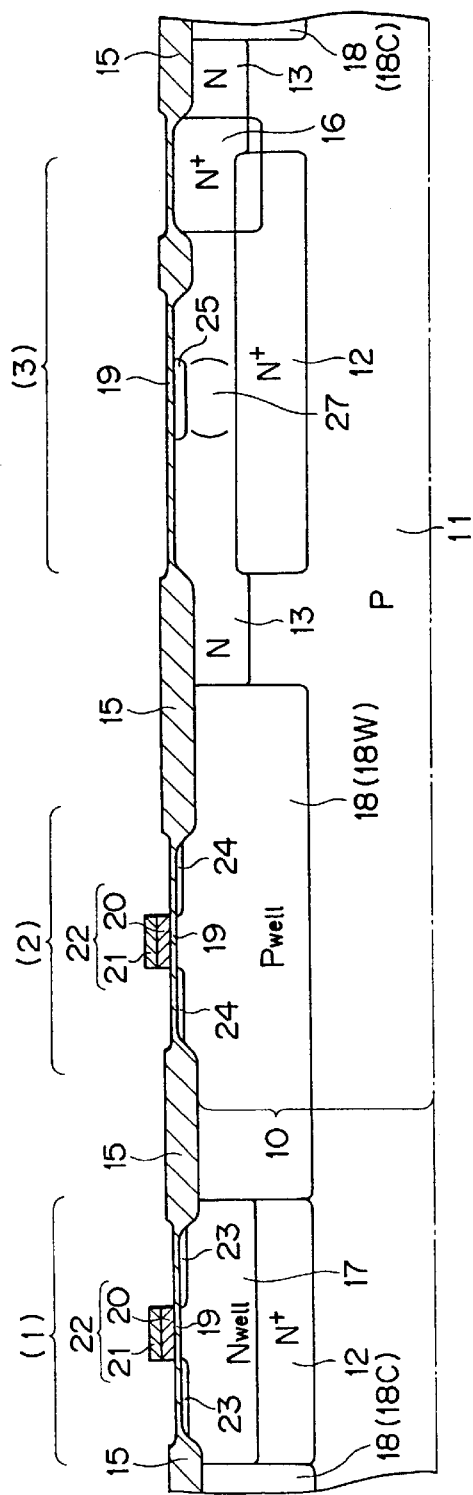
FIGS. 12A and 12B are diagrams showing a step of producing the semiconductor device shown in FIGS. 9A and 9B.
Figure 12B:
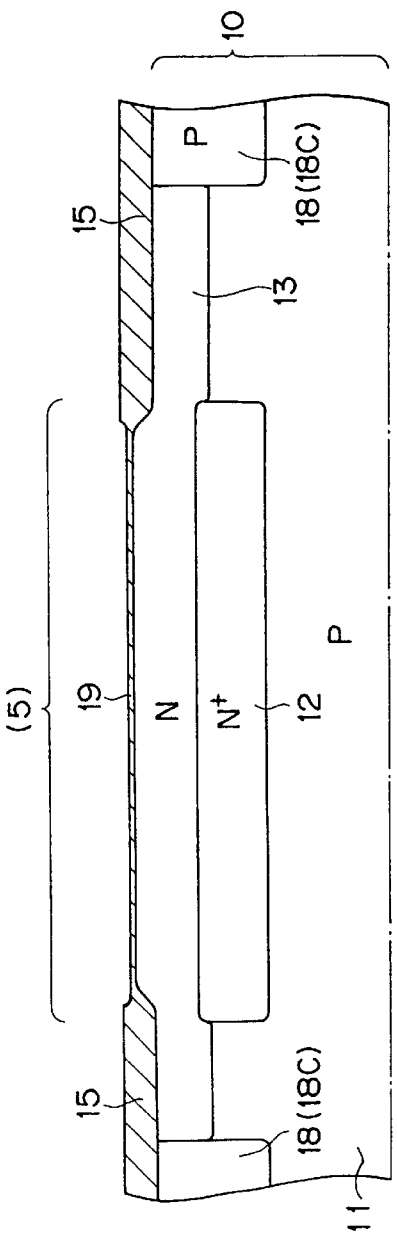

The SIC 27 is formed by ion implantation with N-type impurity through the same opening. The foregoing steps are illustrated in FIGS. 12A and 12B.

The silicon oxide film 28 is formed on the entire surface. The opening 29 is formed at the part which becomes the emitter of the NPN transistor 3 in the silicon oxide film 28.

Simultaneously with this step, the opening 51 is formed in the silicon oxide film 28 for connection to the base of the LPNP transistor 5.

On the entire surface is formed the polysilicon film 30 which is heavily doped with N-type impurity. In the part connecting to the base of the LPNP transistor 5, the polysilicon film 30 is connected to the silicon of the semiconductor base 10 through the opening 51 formed in the insulating film 28.

On the polysilicon film 30 is formed the anti-reflection film 31 consisting of a silicon oxide film and a silicon nitride oxide film laminated on top of the other.

The surface is coated with the photoresist 32, which subsequently undergoes patterning which determines the base width of the LPNP transistor 5.

Figure 13A:
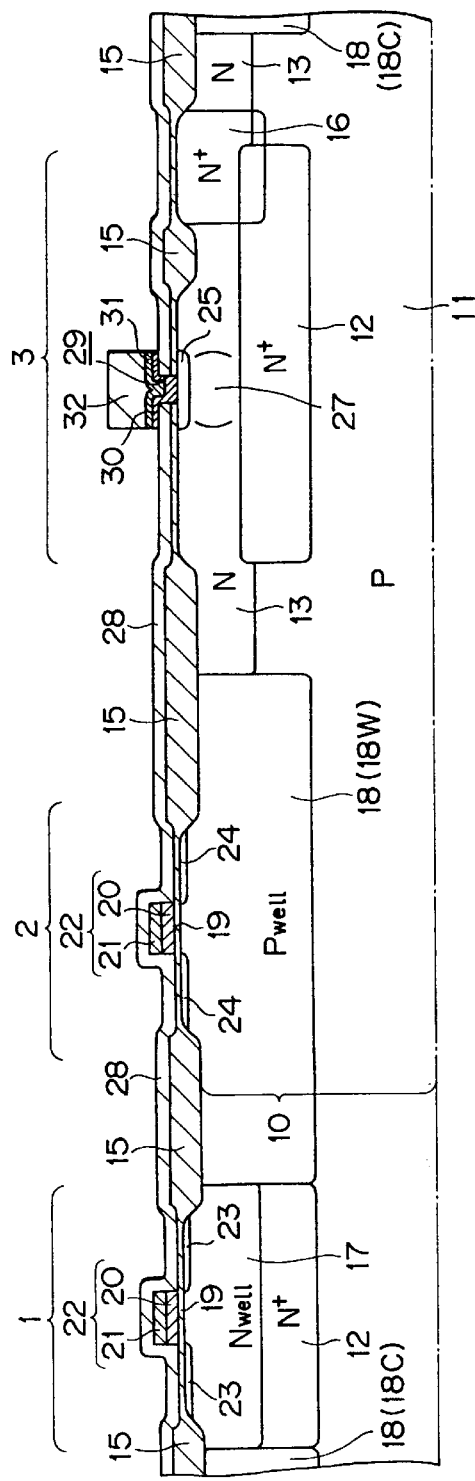
FIGS. 13A and 13B are diagrams showing a step of producing the semiconductor device shown in FIGS. 9A and 9B.
Figure 13B:
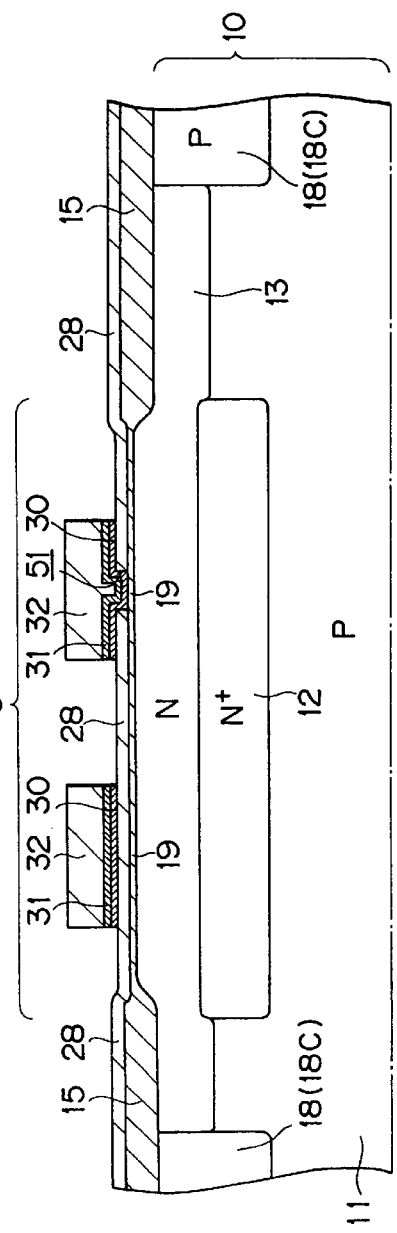

With the photoresist 32 used as a mask, reactive ion etching for patterning is performed consecutively on the anti-reflection film 31 and the polysilicon film 30. The foregoing steps are illustrated in FIGS. 13A and 13B.

With the photoresist 32 used as a mask, reaction ion etching is performed on the silicon oxide film 28 to form the side walls 28 on the flanks of the gate electrodes 22 and 23.

In this step for the LPNP transistor 5, the reaction ion etching does not cause damage to the N-type epitaxial layer 13 at the part which becomes the base region layer because it is covered by the silicon oxide film 28 and the polysilicon film 30.

Subsequently, the photoresist 32 is removed.

Figure 14A:
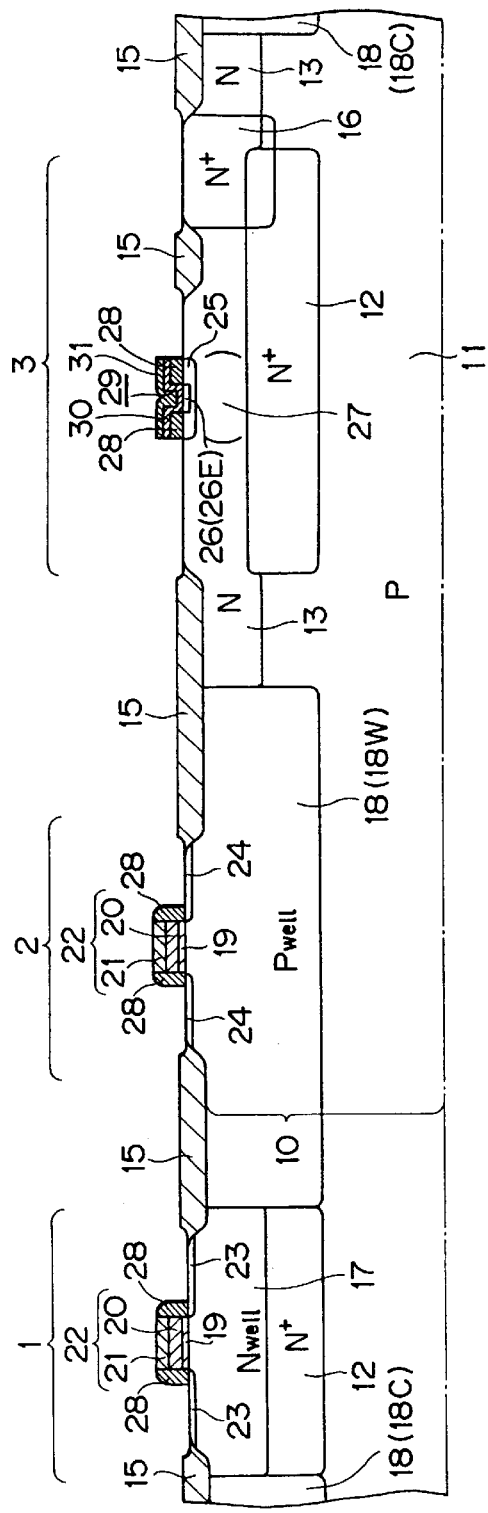
FIGS. 14A and 14B are diagrams showing a step of producing the semiconductor device shown in FIGS. 9A and 9B.
Figure 14B:
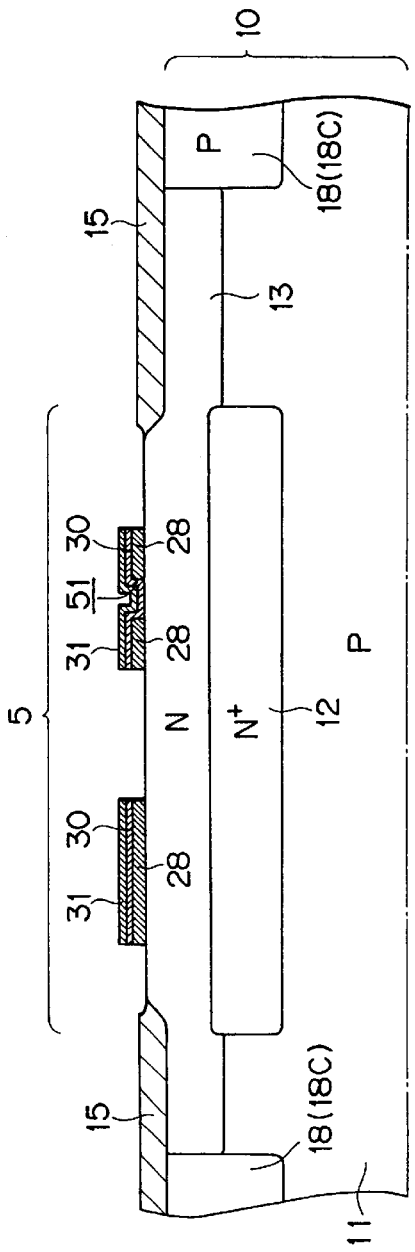

In the LPNP transistor 5, the silicon oxide 28, the polysilicon film 30, and the anti-reflection film 31 remain which cover the N-type epitaxial layer 13 at the part which becomes the base region afterward. The foregoing steps are illustrated in FIGS. 14A and 14B.

A silicon oxide film (not shown) is formed by CVD, and it is grown by thermal oxidation.

The region where the NMOS transistor 2 and the NPN transistor 3 are to be formed is doped with an N-type impurity by ion implantation. The resulting N-type impurity region 34 connects to the source/drain region of the NMOS transistor 2 and the collector of the NPN transistor 3.

Figure 15A:
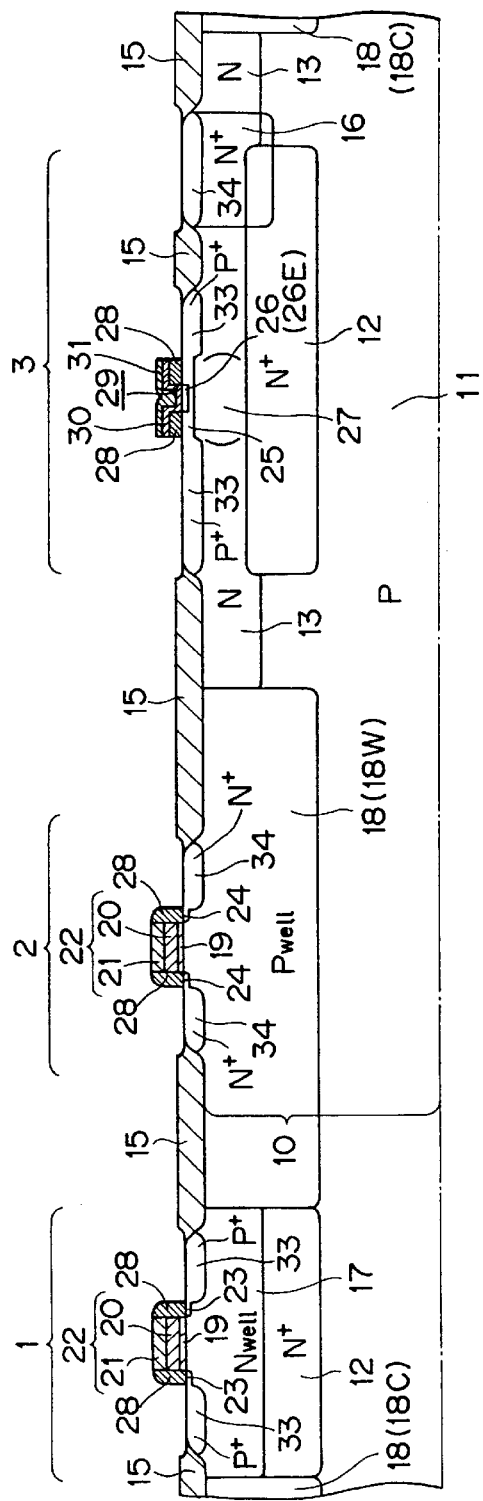
FIGS. 15A and 15B are diagrams showing a step of producing the semiconductor device shown in FIGS. 9A and 9B.
Figure 15B:
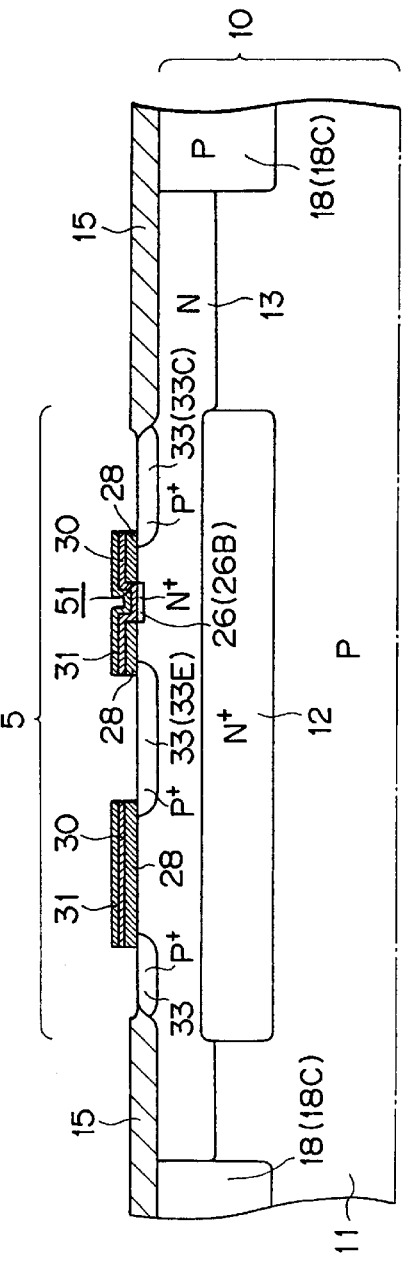
Figure 16A:
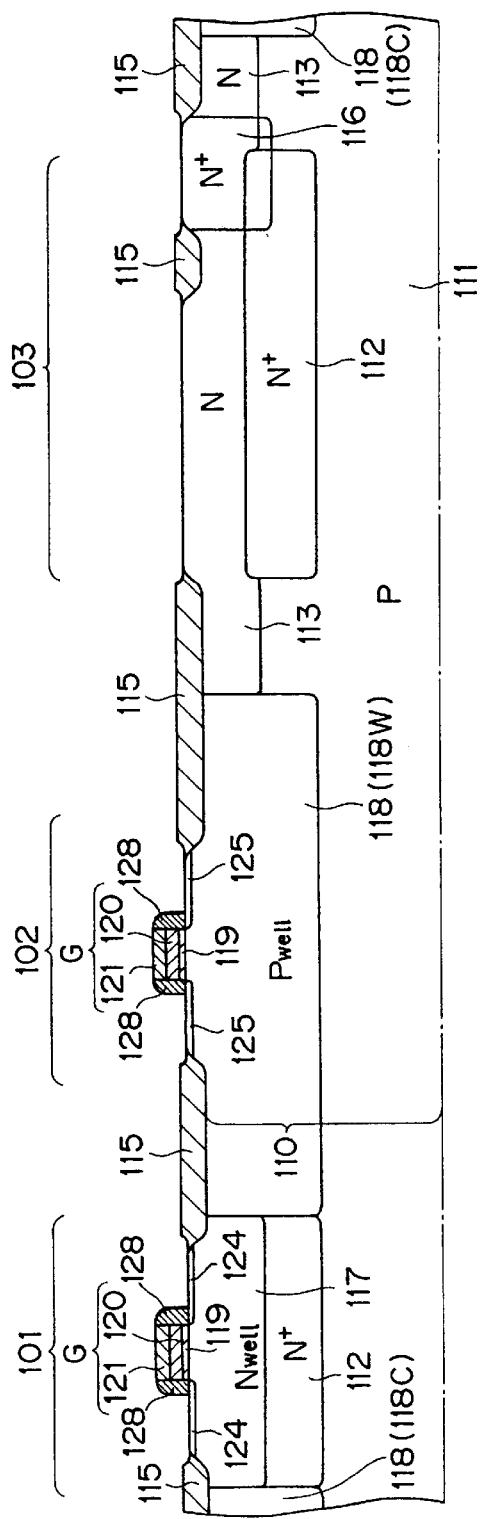
FIGS. 16A and 16B are schematic sectional views showing the structure of a conventional BiCMOS semiconductor device which was taken immediately after side walls had been formed.
Figure 16B:
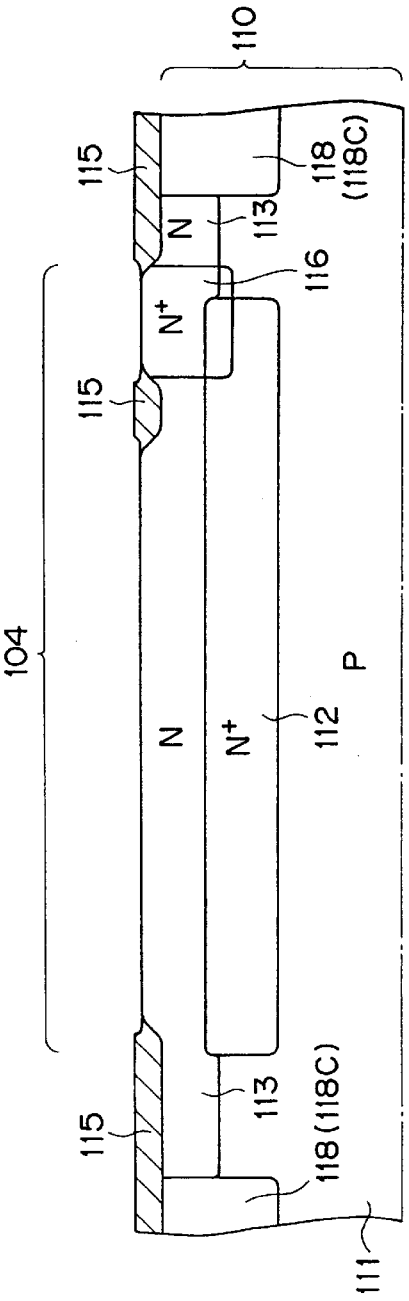

Doping with a P-type impurity is performed by ion implantation on the regions were the PMOS transistor 1, the NPN transistor 3, and the LPNP transistor 4 are to be formed. The resulting P-type impurity region 33 constitutes the source/drain region of the PMOS transistor 1, the graft base region of the NPN transistor 3, and the emitter region 33E/collector region 33C of the LPNP transistor 5. The foregoing steps are illustrated in FIGS. 15A and 15B.

The graft base region of the NPN transistor 3 and the emitter region 33E/collector region 33C of the LPNP transistor 5 have their position determined by the polysilicon film 30 and the anti-reflection film 31 placed thereon for self alignment.

Therefore, the emitter-collector distance in the LPNP transistor 5 is determined by the width of the polysilicon film 30.

The anti-reflection film 31 functions as a mask at the time of doping with a P-type impurity by ion implanting to form the graft base region of the NPN transistor 3 and the emitter region 33E/collector region 33C of the LPNP transistor 5. Therefore, the anti-reflection film 31 protects the polysilicon film 30 from being doped with a P-type impurity. The peak concentration of the P-type impurity remains in the anti-reflection film 31.

The steps mentioned above are followed by ordinary steps employed in the production of BiCMOS semiconductor devices.

On the entire surface is formed the interlayer insulator 35 of boron-phosphorus silicate glass (BPSG).

Those openings (contact holes) listed below are made in the interlayer insulator 35. Each contact hole is filled later with the plug layer 43 for wire connection.

The openings 36 and 37 are formed in the PMOS transistor 1. The openings 38 and 39 are formed in the NMOS transistor 2. The openings 40, 41, and 42 are formed in the NPN transistor 3. The opening which reaches the emitter region 33 of the LPNP transistor 5 is formed. The opening 57 which reaches the polysilicon region 30 of the electrode connecting to the base is formed. The opening 58 which reaches the collector region 33 is formed.

Each of the openings 36 to 42 and 56 to 58 is filled with tungsten to form the plug layer 43 in the usual way, and wiring to each part is made as follows through the plug layer 43 by the ordinary wiring technique.

The wiring 44 and 45 of the PMOS transistor 1, the wiring 46 and 47 of the NMOS transistor 2, the wirings 48, 49, and 50 of the NPN transistor 3 are formed. The wiring 64 for connection to the polysilicon region 30 of the electrode connecting to the base and the wiring 65 for connection to the collector region 33 are formed.

Now, the PMOS transistor 1, the NMOS transistor 2, the NPN bipolar transistor 3, and the LPNP transistor 5 are formed on the semiconductor base 10, and there is obtained the BiCMOS semiconductor device as shown in FIGS. 9A and 9B.

As in the first embodiment, the second embodiment mentioned above produces the following effects.

The insulating film 28 and the polysilicon film 30 protect the surface of the N-type epitaxial layer 13 of the LPNP transistor 5 from damage by reactive ion etching.

The anti-reflection film 31 formed on the polysilicon film 30 prevents the resist film to form the polysilicon film 30 from changing in pattern. In addition, it protects the polysilicon film 30 against entrance of impurity by ion implantation to form the emitter region/collector region.

Since the LPNP transistor 5 has the base lead which is constructed such that the N-type polysilicon film 30 is connected to the silicon surface of the N-type polysilicon film 30 through the opening of the insulating film 28, the region 26B connecting to the N-type base can be formed by diffusion of an N-type impurity into the semiconductor base 10 from the N-type polysilicon film 30 at the part connecting to the base. Thus it is possible to arrange the part connecting to the base between the emitter and the connector. This leads to reduction in the area occupied by the emitter, base, and collector.

The cell size is smaller as compared with that of the LPNP transistor 4 shown in FIG. 2. Thus, the resulting LPNP transistor 5 has a small parasitic capacity.

Since the base lead of the LPNP transistor 5 is constructed in the same way as the part connecting to the emitter of the NPN transistor 3, it can be formed by the same step simultaneously with the part connecting to the emitter of the NPN transistor 3. This permits the cell size to be reduced without increase in the number of manufacturing steps.

The step of forming in the silicon oxide film 28 the opening 29 for the part connecting to the emitter of the NPN transistor 3 can be carried out simultaneously with the step of forming the opening 51 for the part connecting to the base of the LPNP transistor 5. In this way it is possible to fill the opening 51, thereby forming the N-type polysilicon film 30, to form the region 26B connecting to the base by diffusing an N-type impurity from the N-type polysilicon film 30, and to reduce the area occupied by the emitter, base, and collector.

The cell size of the LPNP transistor 5 can be reduced (and hence the element size can be made much smaller). This leads to a higher degree of integration of the BiCMOS semiconductor device having the LPNP transistor 5.

The second embodiment is intended for the BiCMOS semiconductor device in which the LPNP transistor 5 is formed together with the MOS transistors 1 and 2 on the same semiconductor base 10. However, the present invention is not limited to such a BiCMOS semiconductor device.

The structure of the LPNP transistor 5 shown in FIG. 10B may also be applied to a bipolar semiconductor device in which no MOS transistor is formed. In this case, too, it is possible to reduce the area occupied by the LPNP transistor 5 and to increase the degree of integration of the bipolar semiconductor device.

In the above-mentioned embodiments, reference is made to the PNP-type transistor as the lateral bipolar transistor; however, the present invention may be applied equally to lateral bipolar transistors of NPN type.

The present invention is not limited to the above-mentioned embodiments. Various changes and modifications may be made in the invention without departing from the spirit and scope thereof.

The semiconductor device having a lateral bipolar transistor has a small cell size for the lateral bipolar transistor and hence has a small parasitic capacity. In fabrication, the electrode layer connecting to the base can be utilized for self alignment to form the emitter region and the collector region at both sides of the base region. Thus it is possible to form the emitter region, the base region, and the collector region close together and to reduce the cell size.

The resulting lateral bipolar transistor has a smaller size, and this contributes to a higher degree of integration of the semiconductor device.

The semiconductor device consisting of a lateral bipolar transistor and MOS transistors is produced in such a way that the surface of the base region, which becomes the active region of the lateral bipolar transistor, is protected from damage by the insulating film when the insulating film undergoes etching to form the side walls of the MOS transistor. Thus it is possible to prevent the current amplification factor ($h_{FE}$) at low current from decreasing due to increase in the surface recombination current, and it is possible to improve the characteristic properties of the lateral bipolar transistor. This leads to improvement in the reliability of the semiconductor device.

If the same insulating film is used to form the side wall on the gate electrode of the MOS transistor and the insulating film on the base region of the MOS transistor, it is possible to form them simultaneously by the same step. This contributes to reduction in the number of manufacturing steps.

The anti-reflection film formed on the polysilicon film prevents the pattern from changing due to exposure. It also prevents the polysilicon film from changing in the impurity concentration due to entrance of impurity at the time of ion implantation. This permits a certain level of impurity concentration to be kept in the region which is formed by doping the surface of the semiconductor substrate with an impurity from the polysilicon film.

What is claimed is:

1. A semiconductor device having lateral bipolar transistors formed on a semiconductor base, characterized in that an opening is formed in an insulating film formed over said semiconductor base at a base connecting part of said lateral bipolar transistor and an electrode of said base connecting part is formed such that it connects to said semiconductor base through said opening and it covers a base region between the emitter and the collector and further wherein emitter and/or collector regions are formed with a multi-layer stack comprising an insulating layer, a polysilicon film and an anti-reflection film; and the device is constructed such that vertical bipolar transistors are additionally formed on the semiconductor base, and the electrode of the base connecting part covering the base region of the lateral bipolar transistor and the emitter electrode of the vertical transistor are formed from a common layer.

2. The semiconductor device as defined in claim 1, which is constructed such that an anti-reflection film is formed on an electrode layer for the base connecting part.

3. A semiconductor device which is characterized in that lateral bipolar transistors and MOS transistors are formed on a common semiconductor base and side walls on a gate electrode of said MOS transistor and insulating film covering a base region of a base connecting part of said lateral bipolar transistor are formed with a common insulating film and further wherein emitter and/or collector regions are formed with a multi-layer stack comprising an insulating layer, a polysilicon film and an anti-reflection film and further wherein the device is constructed such that vertical bipolar transistors are additionally formed on the semiconductor base, and the electrode layer of the base connecting part that covers the base region and the emitter electrode of the vertical transistor are formed from a common layer.

4. The semiconductor device as defined in claim 3, which is constructed such that an electrode layer of the base connecting part connects to the semiconductor base through an opening formed in an insulating film that is formed over the semiconductor base and covers the base region between the emitter and the collector.

5. A process for producing a semiconductor device having MOS transistors and lateral bipolar transistors formed on a common semiconductor base, said process comprising a step of forming a gate electrode of said MOS transistor, a step of forming an insulating film over an entire surface, a step of forming a mask layer that coven a base region between an emitter and collector of said lateral bipolar transistor, and a step of etching said insulating film, thereby forming side walls for said gate electrode and further wherein emitter and/or collector regions are formed with a multi-layer stack comprising an insulating layer, a polysilicon film and an anti-reflection film and further comprising a step of introducing an impurity, thereby forming the emitter region and the collector region of the lateral bipolar transistor by self-alignment through use of the mask layer.

6. The process for producing a semiconductor device as defined in claim 5, wherein the mask layer also forms the electrode layer for the base connecting part of the lateral bipolar transistor.

7. The process for producing a semiconductor device as defined in claim 5, which further comprises a step of forming an anti-reflection layer on an uppermost level of the mask layer and subsequently introducing an impurity, thereby forming the emitter region and the collector region of the lateral bipolar transistor.

* * * * *